（12）United States Patent
Xu et al.

(10) Patent No.: US 11,817,023 B2
(45) Date of Patent: Nov. 14, 2023

(54) DISPLAY SUBSTRATE, DETECTION METHOD AND PREPARATION METHOD THEREOF, AND DISPLAY APPARATUS

(71) Applicants: Hefei BOE Optoelectronics Technology Co., Ltd., Anhui (CN); BOE Technology Group Co., Ltd., Beijing (CN)

(72) Inventors: Fei Xu, Beijing (CN); Jingyong Li, Beijing (CN); Jun Hong, Beijing (CN); Yanbin Wang, Beijing (CN); Wenhong Tian, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 147 days.

(21) Appl. No.: 17/428,643

(22) PCT Filed: Nov. 5, 2020

(86) PCT No.: PCT/CN2020/126692
§ 371 (c)(1),
(2) Date: Aug. 5, 2021

(87) PCT Pub. No.: WO2022/094839
PCT Pub. Date: May 12, 2022

(65) Prior Publication Data
US 2022/0351654 A1 Nov. 3, 2022

(51) Int. Cl.
*G09G 3/00* (2006.01)
*G09G 3/3233* (2016.01)
*H10K 59/131* (2023.01)

(52) U.S. Cl.
CPC ........... *G09G 3/006* (2013.01); *G09G 3/3233* (2013.01); *H10K 59/131* (2023.02);
(Continued)

(58) Field of Classification Search
CPC ................. G09G 3/006; G09G 3/3233; G09G 2300/0426; G09G 2300/0819;
(Continued)

(56) References Cited

U.S. PATENT DOCUMENTS 6,147,617 A  11/2000  Kim
2010/0066375 A1  3/2010  Hente et al.
(Continued)

FOREIGN PATENT DOCUMENTS

CN  101652669 A  2/2010
CN  105702206 A  6/2016
(Continued)

OTHER PUBLICATIONS

Hongguang Xu, "Study on the crucial technologies of OLED-on-silicon microdisplay", Shanghai University Doctoral Dissertation, Sep. 2013.

*Primary Examiner* — Roy P Rabindranath
(74) *Attorney, Agent, or Firm* — Ling Wu; Stephen Yang; Ling and Yang Intellectual Property

(57) ABSTRACT

A display substrate includes a base substrate including a display region and a peripheral region located on at least one side of the display region. The display region is provided with a plurality of sub-pixels, and at least one of the plurality of sub-pixels includes a light-emitting element and a pixel circuit for driving the light-emitting element. The peripheral region includes a detection region, and the detection region is provided with at least one detection electrode which is electrically connected with a first electrode of the light-emitting element and the pixel circuit through a detection lead wire, to detect electrical performance of the light-emitting element through the detection electrode in a detection stage.

18 Claims, 16 Drawing Sheets

(52) U.S. Cl.
CPC .............. *G09G 2300/0426* (2013.01); *G09G 2300/0819* (2013.01); *G09G 2300/0842* (2013.01); *G09G 2310/0294* (2013.01); *G09G 2310/061* (2013.01); *G09G 2310/08* (2013.01); *G09G 2330/021* (2013.01)

(58) Field of Classification Search
CPC ... G09G 2300/0842; G09G 2310/0294; G09G 2310/061; G09G 2310/08; G09G 2330/021; H10K 59/131
See application file for complete search history.

(56) References Cited

U.S. PATENT DOCUMENTS

| | | | | |
|---|---|---|---|---|
| 2010/0164931 | A1* | 7/2010 | Lin | ............... G09G 3/3233 345/211 |
| 2011/0080383 | A1* | 4/2011 | Huang | ............ G02F 1/13454 345/204 |
| 2015/0160276 | A1 | 6/2015 | Moon et al. | |
| 2015/0248856 | A1* | 9/2015 | Kishi | ...................... G09G 3/30 345/212 |
| 2016/0034074 | A1* | 2/2016 | Lee | .................... G06F 3/0448 345/173 |
| 2017/0004773 | A1 | 1/2017 | Kim et al. | |
| 2019/0057648 | A1* | 2/2019 | Xu | ...................... G09G 3/3275 |
| 2020/0135112 | A1* | 4/2020 | Zhang | ................ G09G 3/3233 |
| 2020/0184892 | A1 | 6/2020 | Yang et al. | |
| 2021/0201759 | A1* | 7/2021 | Cho | .................... G09G 3/3233 |
| 2022/0122519 | A1* | 4/2022 | Bower | .................. H01L 25/167 |

FOREIGN PATENT DOCUMENTS

| | | |
|---|---|---|
| CN | 106328027 A | 1/2017 |
| CN | 107170407 A | 9/2017 |
| CN | 109192141 A | 1/2019 |
| CN | 110097842 A | 8/2019 |
| KR | 10-2017-0080822 A | 7/2017 |
| KR | 10-2019-0079826 A | 7/2019 |

* cited by examiner

DISPLAY SUBSTRATE, DETECTION METHOD AND PREPARATION METHOD THEREOF, AND DISPLAY APPARATUS

CROSS-REFERENCE TO RELATED APPLICATION

The present application is a U.S. National Phase Entry of International Application No. PCT/CN2020/126692 having an international filing date of Nov. 5, 2020, the content of which is hereby incorporated by reference in its entirety.

TECHNICAL FIELD

The present disclosure relates to, but is not limited to, the field of display technology, in particular to a display substrate, a detection method thereof, a preparation method thereof, and a display apparatus.

BACKGROUND

Micro Organic Light-emitting Diodes (Micro-OLEDs) are micro-displays that have been developed in recent years, and silicon-based OLEDs are one kind of them. The silicon-based OLED can not only achieve active addressing of pixels, but also achieve the preparation of various functional circuits, including a Timing Control (TCON) circuit, an Over Current Protection (OCP) circuit, or the like, on a silicon-based underlay substrate, which is conducive to reducing the system volume and realizing light weight. The silicon-based OLED is prepared by the mature Complementary Metal Oxide Semiconductor (CMOS) integrated circuit technology, has the advantages of small volume, high resolution (PPI), high refresh rate, etc., and is widely used in the near-eye display field of Virtual Reality (VR) or Augmented Reality (AR).

SUMMARY

The following is a summary of subject matter described in detail herein. This summary is not intended to limit the protection scope of the claims.

Embodiments of the present disclosure provide a display substrate, a detection method thereof, a preparation method thereof, and a display apparatus.

In one aspect, an embodiment of the present disclosure provides a display substrate, including a base substrate, wherein the base substrate includes a display region and a peripheral region located on at least one side of the display region. The display region is provided with a plurality of sub-pixels, and at least one sub-pixel of the plurality of sub-pixels includes a light-emitting element and a pixel circuit for driving the light-emitting element. The peripheral region includes a detection region, and the detection region is provided with at least one detection electrode which is electrically connected with a first electrode of the light-emitting element and the pixel circuit through a detection lead wire, so as to detect electrical performance of the light-emitting element through the detection electrode in a detection stage.

In some exemplary embodiments, the at least one detection electrode is electrically connected with a detection circuit provided in the peripheral region, or the at least one detection electrode is electrically connected with a detection circuit provided on an external circuit board.

In some exemplary embodiments, the detection circuit includes a first control unit, a second control unit and a storage unit. The first control unit is respectively connected with the detection electrode, a first control terminal and a first node, and is configured to supply power to the detection electrode through the first node under control of the first control terminal. The second control unit is respectively connected with a second control terminal, a first signal terminal and the first node, and is configured to charge the first node through the first signal terminal or collect a voltage of the first node through the first signal terminal under control of the second control terminal. The storage unit is respectively connected with the first node and a first power terminal, and is configured to store a voltage of the first node.

In some exemplary implementations, the first control unit includes a fourth transistor, wherein a control electrode of the fourth transistor is connected with the first control terminal, a first electrode of the fourth transistor is connected with the detection electrode, and a second electrode of the fourth transistor is connected with the first node. The second control unit includes a fifth transistor, wherein a control electrode of the fifth transistor is connected with the second control terminal, a first electrode of the fifth transistor is connected with the first signal terminal, and a second electrode of the fifth transistor is connected with the first node. The storage unit includes a second storage capacitor, wherein a first electrode of the second storage capacitor is connected with the first node, and a second electrode of the second storage capacitor is connected with the first power terminal.

In some exemplary embodiments, a distance between adjacent detection electrodes in the detection region ranges from 40 microns to 85 microns.

In some exemplary embodiments, the peripheral region further includes a bonding region located on a side of the display region, and the detection region is located between the display region and the bonding region.

In some exemplary embodiments, a distance between the detection region and the display region may range from 350 microns to 530 microns, and a distance between the detection region and the bonding region may range from 350 microns to 530 microns.

In some exemplary embodiments, a wire width of the detection lead wire ranges from 3.5 microns to 35 microns.

In some exemplary embodiments, the display region is rectangular, which is divided into nine rectangular sub-regions in a form of 3*3. The detection region includes a plurality of detection electrodes, which are connected with first electrodes of light-emitting elements of sub-pixels at center positions and vertex positions of the nine rectangular sub-regions.

In some exemplary embodiments, in a direction perpendicular to the base substrate, the display substrate at least includes an (N−1)th conductive layer and an Nth conductive layer which are sequentially provided away from the base substrate, where N is a positive integer. The (N−1)th conductive layer at least includes a detection lead wire extending from the display region to the detection region, and the detection lead wire is electrically connected with a pixel circuit corresponding to the light-emitting element. The Nth conductive layer at least includes a first electrode of a light-emitting element located in the display region and a detection electrode located in the detection region. A first end of the detection lead wire is connected with a first electrode of the light-emitting element, and a second end of the detection lead wire is connected with the detection electrode.

In some exemplary embodiments, the pixel circuit includes a drive sub-circuit, a voltage transmission sub-circuit and a data writing sub-circuit. The drive sub-circuit includes a control terminal, a first terminal and a second terminal. The voltage transmission sub-circuit is configured to apply a first power voltage provided by a first power line to the first terminal of the drive sub-circuit in response to a light-emitting control signal. The data writing sub-circuit is configured to write a data signal into the control terminal of the drive sub-circuit and store the data signal that has been written in response to a first scanning signal and a second scanning signal. The drive sub-circuit is configured to drive the light-emitting element to emit light under control of the control terminal and the first terminal of the drive sub-circuit.

In some exemplary embodiments, the drive sub-circuit includes a drive transistor, the data writing sub-circuit includes a first transistor, a second transistor and a first storage capacitor, and the voltage transmission sub-circuit includes a third transistor. A control electrode of the drive transistor is connected with the control terminal of the drive sub-circuit, a first electrode of the drive transistor is connected with the first terminal of the drive sub-circuit, and a second electrode of the drive transistor is connected with the second terminal of the drive sub-circuit. A control electrode of the first transistor is connected with a first scanning signal line, a first electrode of the first transistor is connected with a data line, and a second electrode of the first transistor is connected with a control electrode of the drive transistor. A control electrode of the second transistor is connected with a second scanning signal line, a first electrode of the second transistor is connected with the data line, and a second electrode of the second transistor is connected with the control electrode of the drive transistor. A control electrode of the third transistor is connected with a light-emitting control line, a first electrode of the third transistor is connected with a first power line, and a second electrode of the third transistor is connected with a first electrode of the drive transistor. A first electrode of the first storage capacitor is connected with the control electrode of the drive transistor, and a second electrode of the first storage capacitor is connected with a second power line. A first electrode of the light-emitting element is connected with the second electrode of the drive transistor, and a second electrode of the light-emitting element is connected with a third power line.

In some exemplary embodiments, the pixel circuit includes a drive sub-circuit, a voltage transmission sub-circuit and a data writing sub-circuit. The drive sub-circuit includes a control terminal, a first terminal and a second terminal. The voltage transmission sub-circuit is configured to apply a reset voltage and a first power voltage to the first terminal of the drive sub-circuit in response to a transmission control signal, respectively. The data writing sub-circuit is configured to write a data signal into the control terminal of the drive sub-circuit and store the data signal that has been written in response to a first scanning signal and a second scanning signal. The drive sub-circuit is configured to drive the light-emitting element to emit light under control of the control terminal and the first terminal of the drive sub-circuit. The peripheral region is provided with a voltage control circuit, wherein the voltage control circuit is connected with the pixel circuit, and is configured to provide a reset voltage to the voltage transmission sub-circuit of the pixel circuit in response to a reset control signal and to provide a first power voltage to the voltage transmission sub-circuit in response to a light-emitting control signal.

In some exemplary embodiments, the drive sub-circuit includes a drive transistor, the data writing sub-circuit includes a first transistor, a second transistor and a first storage capacitor, and the voltage transmission sub-circuit includes a third transistor. The voltage control circuit includes a sixth transistor and a seventh transistor. A control electrode of the drive transistor is connected with the control terminal of the drive sub-circuit, a first electrode of the drive transistor is connected with the first terminal of the drive sub-circuit, and a second electrode of the drive transistor is connected with the second terminal of the drive sub-circuit. A control electrode of the first transistor is connected with a first scanning signal line, a first electrode of the first transistor is connected with a data line, and a second electrode of the first transistor is connected with a control electrode of the drive transistor. A control electrode of the second transistor is connected with a second scanning signal line, a first electrode of the second transistor is connected with the data line, and a second electrode of the second transistor is connected with the control electrode of the drive transistor. A control electrode of the third transistor is connected with a transmission control line, a first electrode of the third transistor is connected with a second electrode of the sixth transistor and a first electrode of the seventh transistor, and a second electrode of the third transistor is connected with a first electrode of the drive transistor. A first electrode of the first storage capacitor is connected with the control electrode of the drive transistor, and a second electrode of the first storage capacitor is connected with a second power line. A control electrode of the sixth transistor is connected with a reset control line, a first electrode of the sixth transistor is connected with a reset voltage line, a control electrode of the seventh transistor is connected with a light-emitting control line, and a second electrode of the seventh transistor is connected with a first power line. A first electrode of the light-emitting element is connected with the second electrode of the drive transistor, and a second electrode of the light-emitting element is connected with a third power line.

In some exemplary embodiments, the first transistor is a first semiconductor type MOS transistor, and the second transistor, the third transistor and the drive transistor are all second semiconductor type MOS transistors. The doping type of the first semiconductor type is opposite to that of the second semiconductor type.

In some exemplary embodiments, in a direction perpendicular to the base substrate, the display substrate includes an active layer, a first conductive layer, a second conductive layer, a third conductive layer, a fourth conductive layer, a fifth conductive layer, a sixth conductive layer, a seventh conductive layer and an eighth conductive layer which are sequentially provided on the base substrate. The active layer at least includes active regions of a plurality of transistors of the pixel circuit. The first conductive layer at least includes control electrodes of a plurality of transistors of the pixel circuit. The second conductive layer at least includes first and second electrodes of a plurality of transistors of the pixel circuit, the first power line, the second power line, the light-emitting control line and the data line. The third conductive layer at least includes a first adapter electrode for connecting the second electrode of the first transistor, the second electrode of the second transistor and the control electrode of the drive transistor, a second adapter electrode for connecting the control electrode of the first transistor and the first scanning signal line, and a third adapter electrode for connecting the control electrode of the second transistor and the second scanning signal line. The fourth conductive layer at least includes the first scanning signal line, the second scanning signal line, and first and second electrodes of a first sub-capacitor. The fifth conductive layer at least includes a first electrode of a second sub-capacitor. The sixth conductive layer at least includes a second electrode of the second sub-capacitor. The first sub-capacitor and the second sub-capacitor are connected in parallel to form the first storage capacitor. The seventh conductive layer at least includes a fourth adapter electrode for connecting the first electrode of the first sub-capacitor and the second electrode of the second sub-capacitor of the first storage capacitor, and a detection lead wire extending from the display region to the detection region. A first end of the detection lead wire is connected with the second electrode of the drive transistor. The eighth conductive layer at least includes a first electrode of the light-emitting element located in the display region and a detection electrode located in the detection region. The first electrode of the light-emitting element is connected with a first end of the detection lead wire, and the detection electrode is connected with a second end of the detection lead wire.

In another aspect, an embodiment of the present disclosure provides a display apparatus including the display substrate described above.

In another aspect, an embodiment of the present disclosure provides a preparation method of a display substrate, including: providing a base substrate, wherein the base substrate includes a display region and a peripheral region located on at least one side of the display region; and forming a plurality of sub-pixels, at least one detection electrode and a detection lead wire on the base substrate. The plurality of sub-pixels are provided in the display region, and at least one sub-pixel of the plurality of sub-pixels includes a light-emitting element and a pixel circuit for driving the light-emitting element. The peripheral region includes a detection region. The at least one detection electrode is provided in the detection region, and is electrically connected with a first electrode of the light-emitting element and the pixel circuit through a detection lead wire, so as to detect electrical performance of the light-emitting element through the detection electrode in a detection stage.

In another aspect, an embodiment of the present disclosure provides a detection method of a display substrate. The display substrate includes a base substrate, wherein the base substrate includes a display region and a peripheral region located on at least one side of the display region. The display region is provided with a plurality of sub-pixels, and at least one sub-pixel of the plurality of sub-pixels includes a light-emitting element and a pixel circuit for driving the light-emitting element. The detection region is provided with at least one detection electrode which is electrically connected with a first electrode of the light-emitting element and the pixel circuit through a detection lead wire. The peripheral region includes a detection region, the at least one detection electrode is electrically connected with a detection circuit, and the detection circuit includes a first control unit, a second control unit and a storage unit. The first control unit is respectively connected with the detection electrode, a first control terminal and a first node. The second control unit is respectively connected with a second control terminal, a first signal terminal and the first node. The storage unit is respectively connected with the first node and a first power terminal. The detection method includes: disconnecting the detection electrode from the first node under control of the first control terminal of the detection circuit and charging the first node through the first signal terminal under control of the second control terminal in a first sub-stage of detection stage; disconnecting the detection electrode from the first node under control of the second control terminal and supplying power to the detection electrode through the first node under control of the first control terminal in a second sub-stage of detection stage; disconnecting the detection electrode from the first node under control of the first control terminal of the detection circuit, collecting a voltage of the first node through the first signal terminal under control of the second control terminal, and determining electrical performance of the light-emitting element according to the voltage collected from the first signal terminal in a third sub-stage of detection stage.

In some exemplary embodiments, determining electrical performance of the light-emitting element according to the voltage collected from the first signal terminal includes at least one of the following:

when the light-emitting element is in a light-emitting state, calculating an average current of the light-emitting element according to the voltage collected from the first signal terminal in the third sub-stage; calculating an equivalent resistance of the light-emitting element according to the collected voltage and the calculated average current; and determining whether the light-emitting element is in a weak short state or a weak off state according to the equivalent resistance of the light-emitting element; and when the light-emitting element is in an extinguished state, determining a critical turn-on voltage of the light-emitting element according to the voltage collected from the first signal terminal in the third sub-stage.

Other aspects will be understood after the drawings and the detailed description are read and understood.

BRIEF DESCRIPTION OF DRAWINGS

Accompanying drawings are used to provide a further understanding of technical solutions of the present disclosure and constitute a part of the specification to explain the technical solutions of the present disclosure together with embodiments of the present disclosure, and do not constitute any limitation on the technical solutions of the present disclosure. Shapes and sizes of one or more components in the accompanying drawings do not reflect real scales, and are only for a purpose of schematically illustrating contents of the present disclosure.

DETAILED DESCRIPTION

Figure 1:
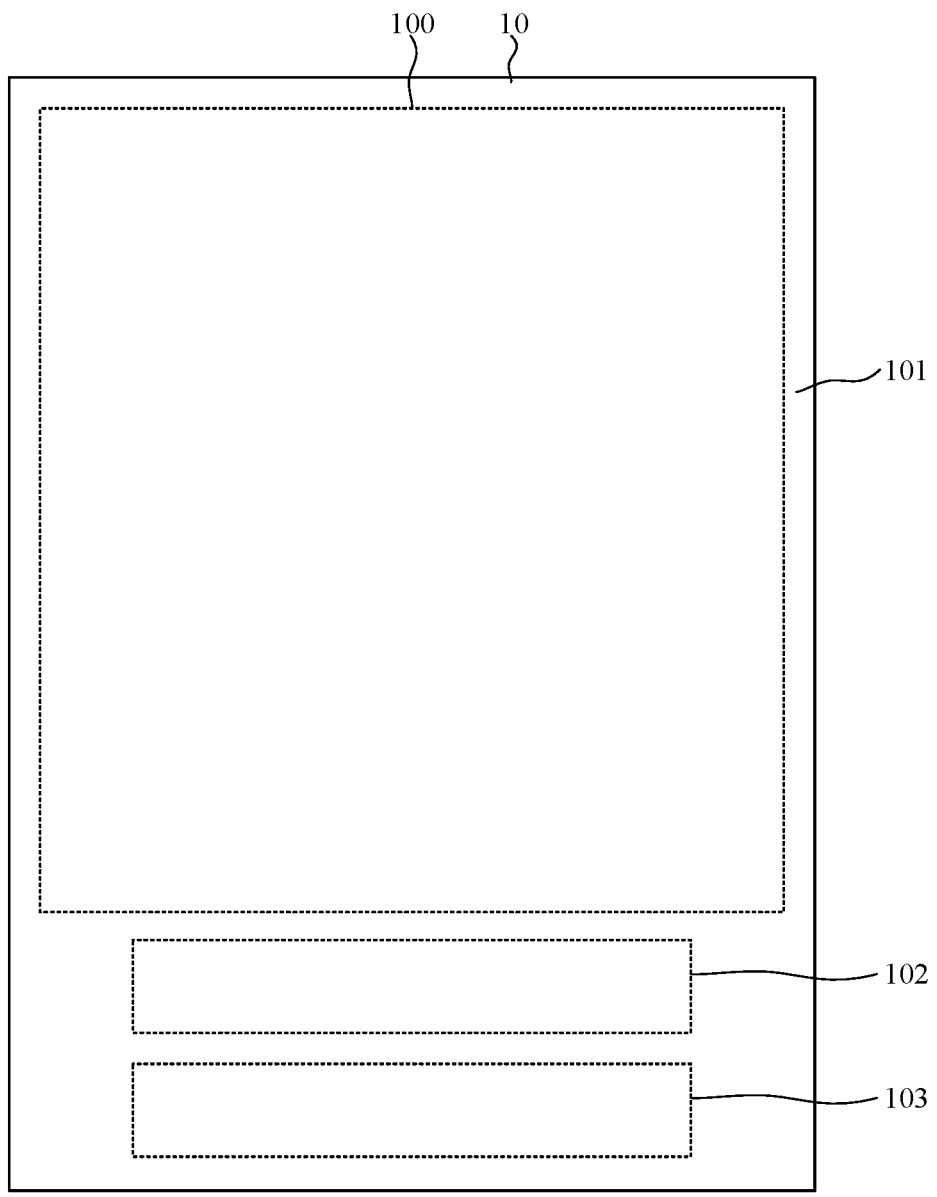
FIG. 1 is a schematic plan view of a display substrate according to at least one embodiment of the present disclosure.

To make the objects, technical solutions and advantages of the present disclosure more clear, embodiments of the present disclosure will be described in detail below with reference to the drawings. The embodiments may be implemented in a number of different forms. Those of ordinary skills in the art will readily understand the fact that implementations and contents may be transformed into one or more of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, size of one or more constituent elements, or thickness or area of a layer, is sometimes exaggerated for clarity. Therefore, an embodiment of the present disclosure is not necessarily limited to the size, and shapes and dimensions of multiple components in the drawings do not reflect real scales. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, not to provide any quantitative limitation. In the present disclosure, "multiple" means two or more in quantity.

In the present disclosure, for the sake of convenience, wordings such as "central", "upper", "lower", "front", "rear", "vertical", "horizontal", "top", "bottom", "inner", "outer" and the others describing the orientations or positional relations are used to depict positional relations of elements with reference to the drawings, which are only convenient for describing the specification and simplifying description, rather than for indicating or implying that the apparatus or element referred to must have a specific orientation, or must be constructed and operated in a particular orientation, and therefore, those wordings cannot be construed as limitations on the present disclosure. The positional relations of the constituent elements may be appropriately changed according to the direction in which constituent elements are described. Therefore, the wordings are not limited in the specification, and may be replaced appropriately according to situations.

In the present disclosure, the terms "installed", "connected" and "coupled" shall be understood in their broadest sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art can understand the specific meanings of the above terms in the present disclosure according to situations.

In the present disclosure, a transistor refers to an element including at least three terminals, namely, a gate electrode, a drain electrode and a source electrode. The transistor has a channel region between the drain electrode (a drain electrode terminal, a drain region or a drain) and the source electrode (a source electrode terminal, a source region or a source), and a current can flow through the drain electrode, the channel region and the source electrode. In the present disclosure, the channel region refers to a region through which the current mainly flows.

In the present disclosure, a first electrode may be a drain electrode while a second electrode may be a source electrode, or a first electrode may be a source electrode while a second electrode may be a drain electrode. Functions of the "source electrode" and the "drain electrode" are sometimes interchangeable in a case where transistors with opposite polarities are used or in a case where the current direction changes during circuit operation. Therefore, in the present disclosure, "the source electrode" and "the drain electrode" are interchangeable.

In the present disclosure, "an electrical connection" includes a case where constituent elements are connected via an element having a certain electrical action. The "element with a certain electric action" is not particularly limited as long as it can transmit and receive electrical signals between the connected constituent elements. Examples of the "element having a certain electrical action" not only include electrodes and wirings, but also include switch elements (such as transistors), resistors, inductors, capacitors, and other elements with one or more functions.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, sometimes "conductive layer" may be replaced by "conductive film". Similarly, "insulating film" may sometimes be replaced by "insulating layer".

"About" in the present disclose means that limits are not made strictly, and the values within a range of process and measurement errors are allowable.

In the present disclosure, "thickness" refers to a height from a surface close to the substrate to a surface away from the substrate in a direction of a plane perpendicular to the substrate.

A Micro OLED display usually has a size of less than 3 inches, which involves combination of organic light emitting diode (OLED) technology and CMOS technology. An OLED array is prepared on a silicon-based substrate including a CMOS circuit. At present, it is difficult to monitor electrical characteristics of the OLED (for example, a critical turn-on voltage, a size of a leakage current, whether there is weak short or weak off, etc. of the OLED) in the design of the micro OLED display, and it is difficult to find out defects of electrical characteristics of OLED devices in the factory test, which will gradually increase with the increase of use time and the influence of environment, resulting in poor performance, and even some defects will heavily affect the customer experience.

At least one embodiment of the present disclosure provides a display substrate, including a base substrate including a display region and a peripheral region located on at least one side of the display region. The display region is provided with a plurality of sub-pixels, and at least one sub-pixel of the plurality of sub-pixels includes a light-emitting element and a pixel circuit for driving the light-emitting element. The peripheral region includes a detection region, and the detection region is provided with at least one detection electrode which is electrically connected with a first electrode of the light-emitting element and the pixel circuit through a detection lead wire, to detect electrical performance of the light-emitting element through the detection electrode in a detection stage.

According to the display substrate provided in this embodiment, the electrical performance of the light-emitting element in the display region may be detected by connecting the first electrode of the light-emitting element and the pixel circuit located in the display region with the detection electrode located in the peripheral region through the detection lead wire, thereby providing support for analysis of the defects of the display substrate.

In some exemplary embodiments, the at least one detection electrode is electrically connected with a detection circuit provided in the peripheral region, or the at least one detection electrode is electrically connected with a detection circuit provided on an external circuit board. In other words, the detection circuit is provided in a non-display region other than the display region.

In some exemplary embodiments, the detection electrode provided in the detection region of the peripheral region is directly electrically connected with the first electrode of the light-emitting element and the pixel circuit. That is, the detection electrode is directly electrically connected with the pixel circuit through the detection lead wire, and no other transistors is connected therebetween. The detection electrode provided in the detection region is equivalent to a signal lead-out terminal of the pixel circuit and the light-emitting element, so that the signal lead-out terminal may be connected through a detection circuit provided on an external circuit board to detect the electrical performance of the light-emitting element.

In some exemplary embodiments, the detection circuit includes a first control unit, a second control unit and a storage unit. The first control unit is respectively connected with the detection electrode, a first control terminal and a first node, and is configured to supply power to the detection electrode through the first node under control of the first control terminal. The second control unit is respectively connected with a second control terminal, a first signal terminal and the first node, and is configured to charge the first node through the first signal terminal or collect a voltage of the first node through the first signal terminal under control of the second control terminal. The storage unit is respectively connected with the first node and a first power terminal, and is configured to store a voltage of the first node.

In some exemplary embodiments, the first control unit includes a fourth transistor. A control electrode of the fourth transistor is connected with the first control terminal, a first electrode of the fourth transistor is connected with the detection electrode, and a second electrode of the fourth transistor is connected with the first node. The second control unit includes a fifth transistor. A control electrode of the fifth transistor is connected with the second control terminal, a first electrode of the fifth transistor is connected with the first signal terminal, and a second electrode of the fifth transistor is connected with the first node. The storage unit includes a second storage capacitor. A first electrode of the second storage capacitor is connected with the first node, and a second electrode of the second storage capacitor is connected with the first power terminal. However, this is not limited in the present embodiment.

In some exemplary embodiments, a distance between adjacent detection electrodes in the detection region ranges from 40 microns to 85 microns. For example, the distance between adjacent detection electrodes in the detection region may be 50 microns, or 70 microns. However, this is not limited in the present embodiment.

In some exemplary embodiments, the peripheral region further includes a bonding region located on a side of the display region. The detection region is located between the display region and the bonding region.

In some exemplary embodiments, a distance between the detection region and the display region ranges from 350 microns to 530 microns, and a distance between the detection region and the bonding region ranges from 350 microns to 530 microns. For example, the detection region is located between the display region and the bonding region, the distance between the detection region and the display region is 440 microns, and the distance between the detection region and the bonding region is 440 microns. However, this is not limited in the present embodiment. For example, the distance between the detection region and the display region may be different from the distance between the detection region and the bonding region.

In some exemplary embodiments, a wire width of the detection lead wire ranges from 3.5 microns to 35 microns.

For example, the wire width of the detection lead wire may be 35 microns. However, this is not limited in the present embodiment.

In some exemplary embodiments, the display region is rectangular and is divided into nine rectangular sub-regions in a form of 3*3. The detection region includes a plurality of detection electrodes. The plurality of detection electrodes are connected with first electrodes of light-emitting elements of sub-pixels at center positions and vertex positions of the nine rectangular sub-regions. For example, if the number of the detection electrodes in the detection region is 25, and the nine rectangular sub-regions include 9 center positions and 16 vertex positions in total, then the 25 detection electrodes are connected in one-to-one correspondence with the first electrodes of the light-emitting elements of the sub-pixels corresponding to the 25 positions. However, the number and position of the sub-pixels connected by the detection electrodes are not limited in this embodiment.

In some exemplary embodiments, in a direction perpendicular to the base substrate, the display substrate at least includes an (N−1)th conductive layer and an Nth conductive layer which are sequentially provided away from the base substrate, where N is a positive integer. The (N−1)th conductive layer at least includes a detection lead wire extending from the display region to the detection region, and the detection lead wire is electrically connected with a pixel circuit corresponding to the light-emitting element. The Nth conductive layer at least includes a first electrode of the light-emitting element located in the display region and a detection electrode located in the detection region. A first end of the detection lead wire is connected with a first electrode of the light-emitting element, and a second end of the detection lead wire is connected with the detection electrode. In this exemplary embodiment, the detection electrode is provided in the same layer as the first electrode of the light-emitting element, and is connected through a detection lead wire provided in a different layer.

In some exemplary embodiments, the pixel circuit includes a drive sub-circuit, a voltage transmission sub-circuit and a data writing sub-circuit. The drive sub-circuit includes a control terminal, a first terminal and a second terminal. The voltage transmission sub-circuit is configured to apply a first power voltage provided by a first power line to the first terminal of the drive sub-circuit in response to a light-emitting control signal. The data writing sub-circuit is configured to write a data signal into the control terminal of the drive sub-circuit and store the data signal that has been written in response to a first scanning signal and a second scanning signal. The drive sub-circuit is configured to drive the light-emitting element to emit light under control of the control terminal and the first terminal of the drive sub-circuit.

In some exemplary embodiments, the drive sub-circuit includes a drive transistor. The data writing sub-circuit includes a first transistor, a second transistor and a first storage capacitor. The voltage transmission sub-circuit includes a third transistor. A control electrode of the drive transistor is connected with the control terminal of the drive sub-circuit, a first electrode of the drive transistor is connected with the first terminal of the drive sub-circuit, and a second electrode of the drive transistor is connected with the second terminal of the drive sub-circuit. A control electrode of the first transistor is connected with a first scanning signal line, a first electrode of the first transistor is connected with a data line, and a second electrode of the first transistor is connected with a control electrode of the drive transistor. A control electrode of the second transistor is connected with a second scanning signal line, a first electrode of the second transistor is connected with the data line, and a second electrode of the second transistor is connected with the control electrode of the drive transistor. A control electrode of the third transistor is connected with a light-emitting control line, a first electrode of the third transistor is connected with a first power line, and a second electrode of the third transistor is connected with the first electrode of the drive transistor. A first electrode of the first storage capacitor is connected with the control electrode of the drive transistor, and a second electrode of the first storage capacitor is connected with a second power line. A first electrode of the light-emitting element is connected with the second electrode of the drive transistor, and a second electrode of the light-emitting element is connected with a third power line.

In some exemplary embodiments, the first transistor is a first semiconductor type Metal Oxide Semiconductor (MOS) transistor, and the second transistor, the third transistor and the drive transistor are all second semiconductor type MOS transistors. The doping type of the first semiconductor type is opposite to that of the second semiconductor type. For example, the first transistor is a P-type transistor, and the second transistor, the third transistor and the drive transistor are all N-type transistors. However, this is not limited in the present embodiment.

In some exemplary embodiments, in a direction perpendicular to the base substrate, the display substrate includes an active layer, a first conductive layer, a second conductive layer, a third conductive layer, a fourth conductive layer, a fifth conductive layer, a sixth conductive layer, a seventh conductive layer and an eighth conductive layer which are sequentially provided on the base substrate. The active layer at least includes active regions of a plurality of transistors of the pixel circuit. The first conductive layer at least includes control electrodes of the plurality of transistors of the pixel circuit. The second conductive layer at least includes first and second electrodes of the plurality of transistors of the pixel circuit, a first power line, a second power line, a light-emitting control line and a data line. The third conductive layer at least includes a first adapter electrode for connecting the second electrode of the first transistor, the second electrode of the second transistor and the control electrode of the drive transistor, a second adapter electrode for connecting the control electrode of the first transistor and the first scanning signal line, and a third adapter electrode for connecting the control electrode of the second transistor and the second scanning signal line. The fourth conductive layer at least includes a first scanning signal line, a second scanning signal line, a first electrode and a second electrode forming a first parallel capacitor of a first storage capacitor. The fifth conductive layer at least includes a first electrode of a second parallel capacitor forming the first storage capacitor. The sixth conductive layer at least includes a second electrode forming a second parallel capacitor of the first storage capacitor. The seventh conductive layer at least includes a fourth adapter electrode for connecting the first electrode of the first parallel capacitor of the first storage capacitor and the second electrode of the second parallel capacitor of the first storage capacitor, and a detection lead wire extending from the display region to the detection region. A first end of the detection lead wire is connected with a second electrode of the drive transistor. The eighth conductive layer at least includes a first electrode of the light-emitting element located in the display region and a detection electrode located in the detection region. The first electrode of the light-emitting element is connected with the first end of the detection lead wire, and the detection electrode is connected with the second end of the detection lead wire.

In some exemplary embodiments, the pixel circuit includes a drive sub-circuit, a voltage transmission sub-circuit and a data writing sub-circuit. The drive sub-circuit includes a control terminal, a first terminal and a second terminal. The voltage transmission sub-circuit is configured to apply a reset voltage and a first power voltage to the first terminal of the drive sub-circuit in response to a transmission control signal, respectively. The data writing sub-circuit is configured to write a data signal to the control terminal of the drive sub-circuit and store the data signal that has been written in response to a first scanning signal and a second scanning signal. The drive sub-circuit is configured to drive the light-emitting element to emit light under control of the control terminal and the first terminal of the drive sub-circuit. The peripheral region is provided with a voltage control circuit which is connected with the pixel circuit. The voltage control circuit is configured to provide a reset voltage to the voltage transmission sub-circuit of the pixel circuit in response to a reset control signal and to provide a first power voltage to the voltage transmission sub-circuit in response to a light-emitting control signal.

In some exemplary embodiments, the drive sub-circuit includes a drive transistor, the data writing sub-circuit includes a first transistor, a second transistor and a first storage capacitor, and the voltage transmission sub-circuit includes a third transistor. The voltage control circuit includes a sixth transistor and a seventh transistor. A control electrode of the drive transistor is connected with a control terminal of the drive sub-circuit, a first electrode of the drive transistor is connected with a first terminal of the drive sub-circuit, and a second electrode of the drive transistor is connected with a second terminal of the drive sub-circuit. A control electrode of the first transistor is connected with a first scanning signal line, a first electrode of the first transistor is connected with a data line, and a second electrode of the first transistor is connected with a control electrode of the drive transistor. A control electrode of the second transistor is connected with a second scanning signal line, a first electrode of the second transistor is connected with the data line, and a second electrode of the second transistor is connected with the control electrode of the drive transistor. A control electrode of the third transistor is connected with a transmission control line, a first electrode of the third transistor is connected with a second electrode of the sixth transistor and a first electrode of the seventh transistor, and a second electrode of the third transistor is connected with a first electrode of the drive transistor. A first electrode of the first storage capacitor is connected with the control electrode of the drive transistor, and a second electrode of the first storage capacitor is connected with a second power line. A control electrode of the sixth transistor is connected with a reset control line, and a first electrode of the sixth transistor is connected with a reset voltage line. A control electrode of the seventh transistor is connected with a light-emitting control line, and a second electrode of the seventh transistor is connected with a first power line. A first electrode of the light-emitting element is connected with a second electrode of the drive transistor, and a second electrode of the light-emitting element is connected with a third power line.

Embodiments of the present disclosure and examples thereof will be described below in detail with reference to the accompanying drawings.

At least one embodiment of the present disclosure provides a display substrate. For example, the display substrate may be a silicon-based OLED display substrate, which may be applied to a virtual reality device or an augmented reality device, or may be other types of display substrates. However, this is not limited in the embodiments of the present disclosure.

FIG. 1 is a schematic plan view of a display substrate according to at least one embodiment of the present disclosure. As shown in FIG. 1, the display substrate includes a base substrate 10. In some examples, the base substrate 10 may be a silicon-based base substrate, which may be a bulk silicon-based substrate or a Silicon-On-Insulator (SOI) substrate. As shown in FIG. 1, the display substrate 10 includes a display region 100, a peripheral region 101 located at a periphery of the display region 100. The peripheral region 101 includes a bonding region 103 located on a side of the display region 100, and a detection region 102 located between the display region 100 and the bonding region 103.

In some exemplary embodiments, the display region 100 is provided with a plurality of sub-pixels, a plurality of scanning lines, and a plurality of data lines, which are distributed in an array. At least one of the sub-pixels includes a light-emitting element and a pixel circuit for driving the light-emitting element. The plurality of scanning lines and the plurality of data lines cross each other to define the plurality of pixel regions distributed in an array in the display region 100, and at least one pixel region is provided with a pixel circuit of one sub-pixel. The pixel circuit may be prepared on the base substrate through a silicon semiconductor process (e.g., CMOS process), and the light-emitting element is prepared on the base substrate with the pixel circuit. The pixel circuit is, for example, a conventional pixel circuit, such as 2T1C (i.e., two transistors and one capacitor) pixel circuit, 4T2C, 5T1C, 7T1C and other nTmC (n and m are positive integers) pixel circuits. In different embodiments, the pixel circuit may further include a compensation sub-circuit, which may include an internal compensation sub-circuit or an external compensation sub-circuit, and may include a transistor, a capacitor, etc. For example, as required, the pixel circuit may further include a reset sub-circuit, a light-emitting control sub-circuit, etc. However, this is not limited in the present embodiment.

In some exemplary embodiments, the peripheral region 101 is provided with a gate drive circuit and a data drive circuit. The gate drive circuit is connected with the pixel circuit through a scanning line to provide at least one scanning signal, and the data drive circuit is connected with the pixel circuit through a data line to provide a data signal. For example, the peripheral region 101 may further be provided with a control circuit configured to control the data drive circuit to apply a data signal and control the gate drive circuit to apply a scanning signal. An example of the control circuit is a timing control circuit. The control circuit may be in various forms, for example, including a memory and a processor, wherein the memory includes an executable code, and the processor runs the executable code to control the data drive circuit to apply a data signal and control the gate drive circuit to apply a scanning signal. However, this is not limited in the present embodiment. In some examples, since silicon-based circuit may achieve higher accuracy, the gate drive circuit and the data drive circuit may be formed in the display region corresponding to the display substrate, and are not necessarily located in the peripheral region of the periphery.

In some exemplary embodiments, the detection region 102 is provided with a plurality of detection electrodes. At least one detection electrode may be connected with the light-emitting element of the corresponding sub-pixel in the display region 100 through a detection lead wire. The plurality of detection electrodes may be arranged regularly, for example, in an array. The plurality of detection electrodes may be configured to be bonded and connected to a Flexible Printed Circuit (FPC). However, this is not limited in the present embodiment.

In some exemplary embodiments, the bonding region 103 is provided with a pad assembly. For example, the pad assembly includes a plurality of strip-shaped bonding electrodes provided at intervals, and may be configured to be bonded to a flexible printed circuit. However, this is not limited in the present embodiment.

Figure 2:
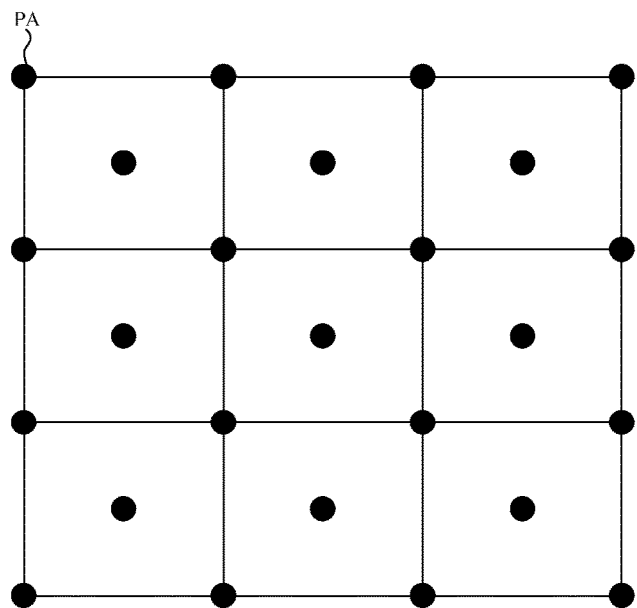
FIG. 2 is a schematic diagram showing positions of sub-pixels in a display region connected with a detection electrode of a display substrate according to at least one embodiment of the present disclosure.

FIG. 2 is a schematic diagram showing positions of sub-pixels in a display region connected with a detection electrode of a display substrate according to at least one embodiment of the present disclosure. In some exemplary embodiments, the rectangular display region may be divided into nine rectangular sub-regions in a form of 3*3, and the sub-pixels located at the center position and the vertex position of each rectangular sub-region are selected as the detection positions for electrical performance. As shown in FIG. 2, since the vertex positions of adjacent rectangular sub-regions overlap, a total of 25 sub-pixels PA (including sub-pixels corresponding to 9 center positions of 9 rectangular sub-regions and sub-pixels corresponding to 16 vertex positions) may be selected as detection positions. For example, the detection region may include at least 25 detection electrodes, and the selected 25 sub-pixels PA may be connected in one-to-one correspondence with the detection electrodes in the detection region, so as to detect the electrical performance of the light-emitting elements of these sub-pixels PA through the detection electrodes. However, this is not limited in the present embodiment. In some examples, the detection region includes a plurality of detection electrodes, and all sub-pixels in the display region may be connected with the plurality of detection electrodes in the detection region in one-to-one correspondence, or all sub-pixels in a certain sub-region of the display region may be connected with the plurality of detection electrodes in the detection region in one-to-one correspondence.

Figure 3:
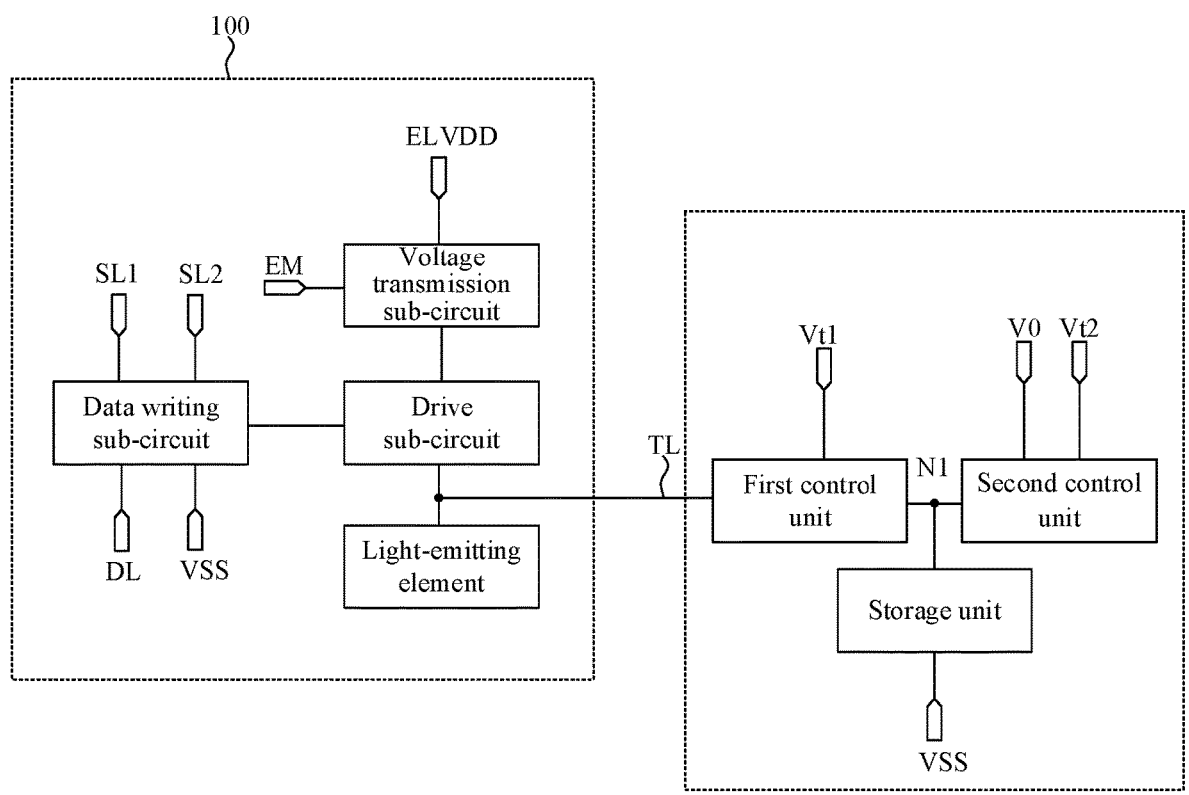
FIG. 3 is a schematic diagram of a pixel circuit and a detection circuit of a display substrate according to at least one embodiment of the present disclosure.

FIG. 3 is a schematic diagram of a pixel circuit and a detection circuit of a display substrate according to at least one embodiment of the present disclosure. The pixel circuit and the light-emitting element of this exemplary embodiment are located in the display region 100, and the detection circuit is located in the peripheral region on at least one side of the display region 100. In some examples, the detection circuit may be provided within the detection region of the peripheral region, or the detection circuit may be provided on an external circuit board. However, this is not limited in the present embodiment.

In some exemplary embodiments, as shown in FIG. 3, the pixel circuit in this exemplary embodiment may include a drive sub-circuit, a voltage transmission sub-circuit and a data writing sub-circuit. The drive sub-circuit includes a control terminal, a first terminal and a second terminal. The voltage transmission sub-circuit is configured to apply a first power voltage provided by a first power line to a first terminal of the drive sub-circuit in response to a light-emitting control signal. The data writing sub-circuit is configured to write a data signal to the control terminal of the drive sub-circuit and store the data signal that has been written in response to a first scanning signal and a second scanning signal. The drive sub-circuit is configured to drive the light-emitting element to emit light under control of the control terminal and the first terminal of the drive sub-circuit.

Figure 4:
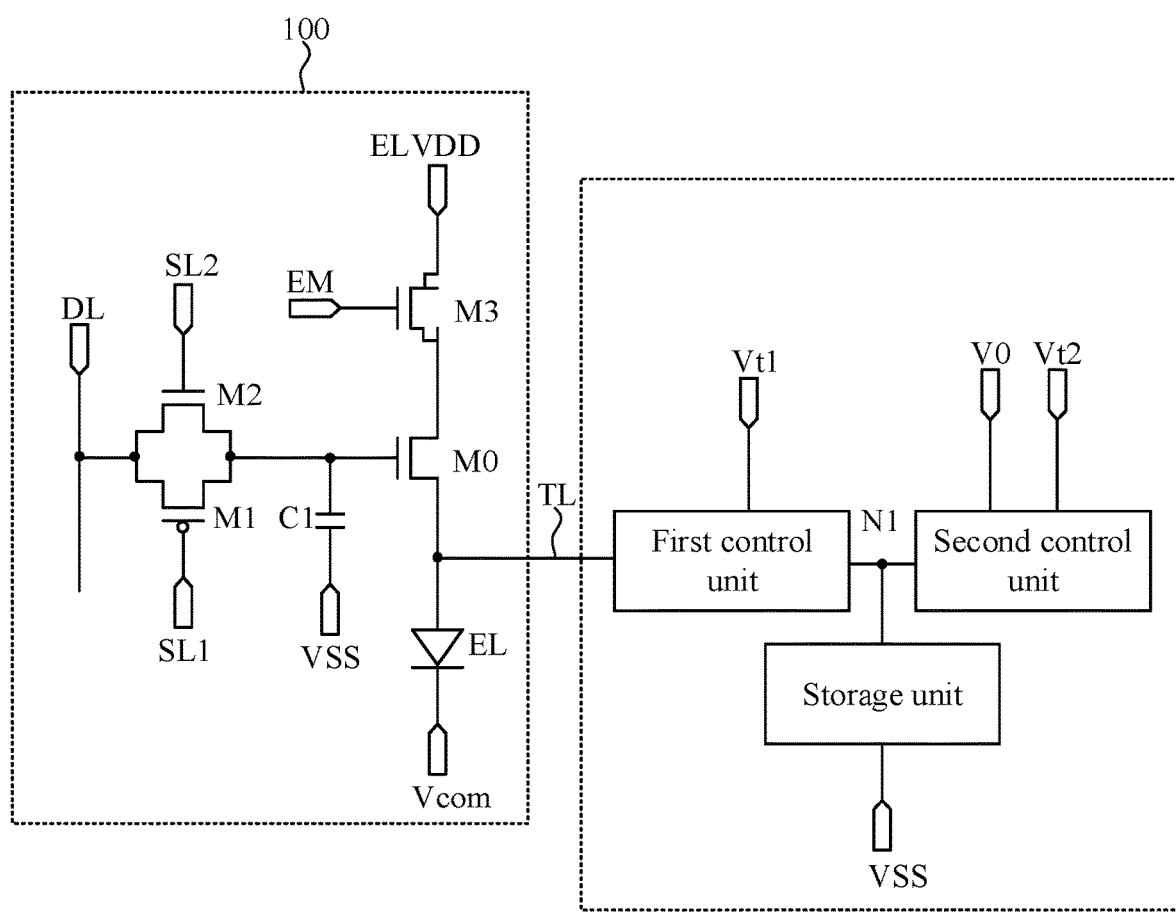
FIG. 4 is a diagram of an equivalent circuit of a pixel circuit of a display substrate according to at least one embodiment of the present disclosure.

FIG. 4 is a diagram of an equivalent circuit of a pixel circuit of a display substrate according to at least one embodiment of the present disclosure. As shown in FIG. 4, in some exemplary embodiments, the drive sub-circuit may include a drive transistor M0. The data writing sub-circuit may include a first transistor M1, a second transistor M2 and a first storage capacitor C1. The voltage transmission sub-circuit includes a third transistor M3. A control electrode of the drive transistor M0 is connected with a first electrode of the first storage capacitor C1, a second electrode of the first transistor M1 and a second electrode of the second transistor M2. A first electrode of the drive transistor M0 is connected with a second electrode of the third transistor M3. A second electrode of the drive transistor M0 is connected with a first electrode of the light-emitting element EL. A control electrode of the first transistor M1 is connected with a first scanning signal line SL1, and a first electrode of the first transistor M1 is connected with the data signal line DL. A control electrode of the second transistor M2 is connected with a second scanning signal line SL2, and a first electrode of the second transistor M2 is connected with the data signal line DL. A control electrode of the third transistor M3 is connected with a light-emitting control line EM, and a first electrode of the third transistor M3 is connected with a first power line ELVDD. A second electrode of the first storage capacitor C1 is connected with a second power line VSS. A second electrode of the light-emitting element EL is connected with a third power line Vcom.

FIG. 4 illustrates an exemplary structure of a pixel circuit. Those skilled in the art may easily understand that implementations of the pixel circuit are not limited to this as long as its functions can be achieved.

In the embodiments of the present disclosure, the symbol SL1 may represent both the first scanning signal line and a level of a first scanning signal provided by the first scanning signal line. Similarly, the symbol SL2 may represent both the second scanning signal line and a level of a second scanning signal provided by the second scanning signal line; the symbol DL may represent both the data line and a level of a data signal provided by the data line; the symbol EM may represent both the light-emitting control line and a level of a light-emitting control signal provided by the light-emitting control line; the symbol ELVDD may represent both the first power line and a first power voltage provided by the first power line; the symbol VSS may represent both the second power line and a second power voltage provided by the second power line; the symbol Vcom may represent both the third power line and a third power voltage provided by the third power line.

In some exemplary embodiments, the drive transistor M0 is configured to drive the light-emitting element EL to emit light under control of the control electrode and the first electrode of the drive transistor M0. The light-emitting element EL emits light of different degrees under control of the drive transistor M0. The first transistor M1 is configured to write the data signal provided by the data line DL into the control electrode of the drive transistor M0 in response to the first scanning signal provided by the first scanning signal line SL1. The second transistor M2 is configured to write the data signal provided by the data line DL into the control electrode of the drive transistor M0 in response to the second scanning signal provided by the second scanning signal line SL2. The third transistor M3 is configured to apply a first power voltage provided by the first power line ELVDD to the first electrode of the drive transistor M0 in response to a light-emitting control signal provided by the light-emitting control line EM. The first storage capacitor C1 is configured to store the data signal that is written into the control electrode of the drive transistor M0.

In some exemplary embodiments, the first power voltage provided by the first power line ELVDD may be a high level voltage, for example, the first power voltage may be 5V. The second power voltage provided by the second power line VSS may be a low level voltage. For example, the second power voltage provided by the second power line VSS may be a negative voltage or a ground voltage (generally 0V). The third power voltage provided by the third power line Vcom may be a low level voltage. For example, the second power voltage provided by the second power line VSS and the third power voltage provided by the third power line Vcom may be the same, for example, both are the ground voltage.

In some exemplary embodiments, the light-emitting element EL may be an OLED. For example, the light-emitting element EL may be an OLED with a top emission structure or a bottom emission structure, and may emit red light, green light, blue light or white light, or the like. For example, the light-emitting element EL may be a micro OLED. However, this is not limited in the present embodiment. For example, the first electrode of the light-emitting element EL is an anode of an OLED, and the second electrode is a cathode of the OLED; or, the first electrode may be the cathode of the OLED, and the second electrode may be the anode of the OLED.

In some exemplary embodiments, the first transistor M1 may be a P-type MOS transistor, and the second transistor M2, the third transistor M3 and the drive transistor M0 may be N-type MOS transistors. However, this is not limited in the present embodiment. In some examples, the types of the first transistor M1 and the second transistor M2 may be the same, which may be designed and determined according to an actual condition.

In this exemplary embodiment, since the first transistor M1 and the second transistor M2 are MOS transistors with opposite semiconductor types, the first transistor M1 and the second transistor M2 may constitute a transmission gate switch with complementary characteristics. In this case, for example, the first scanning signal provided to the first transistor M1 and the second scanning signal provided to the second transistor M2 may be mutually inverted signals, so as to ensure that one of the first transistor M1 and the second transistor M2 is always in a turn-on state at the same time, such that the data signal may be transmitted to the first storage capacitor C1 without voltage loss, thereby improving the reliability and stability of the pixel circuit.

In some exemplary embodiments, as shown in FIG. 4, the first electrode of the light-emitting element EL may be connected with the detection circuit through a detection lead wire TL and a detection electrode (not shown in the Figure) located in the peripheral region. For example, the detection electrode is provided in the detection region of the display substrate, and the detection circuit may be provided in the detection region of the display substrate; or, the detection electrode is provided in the detection region of the display substrate, and the detection circuit may be provided on an external circuit board. As shown in FIGS. 3 and 4, the detection circuit of this exemplary embodiment includes a first control unit, a second control unit and a storage unit. The first control unit is respectively connected with the detection electrode, the first control terminal Vt1 and the first node N1. The detection electrode is connected with the first electrode of the light-emitting element EL of the display region 100 through a detection lead wire TL. The second control unit is respectively connected with the second control terminal Vt2, the first signal terminal V0 and the first node N1. The storage unit is respectively connected with the first node N1 and the first power terminal (for example, to provide the second power voltage VSS). The first control unit is configured to supply power to the detection electrode through the first node N1 under the control of the first control terminal Vt1. The second control unit is configured to charge the first node N1 or collect a voltage of the first node N1 through the first signal terminal V0 under the control of the second control terminal Vt2. The storage unit is configured to store the voltage of the first node N1.

In this exemplary embodiment, the first node N1 does not necessarily represent an actual component, but represents a convergence point of the relevant circuit connections in the circuit diagram. Furthermore, the symbol Vt1 represents both the first control terminal and the level of the first control signal provided by the first control terminal; similarly, the symbol Vt2 represents both the second control terminal and the level of the second control signal provided by the second control terminal; the symbol V0 represents both the first signal terminal and the level of the first input signal provided by the first signal terminal; and the symbol C2 represents both the second storage capacitor and the capacitance value of the second storage capacitor.

Figure 5:
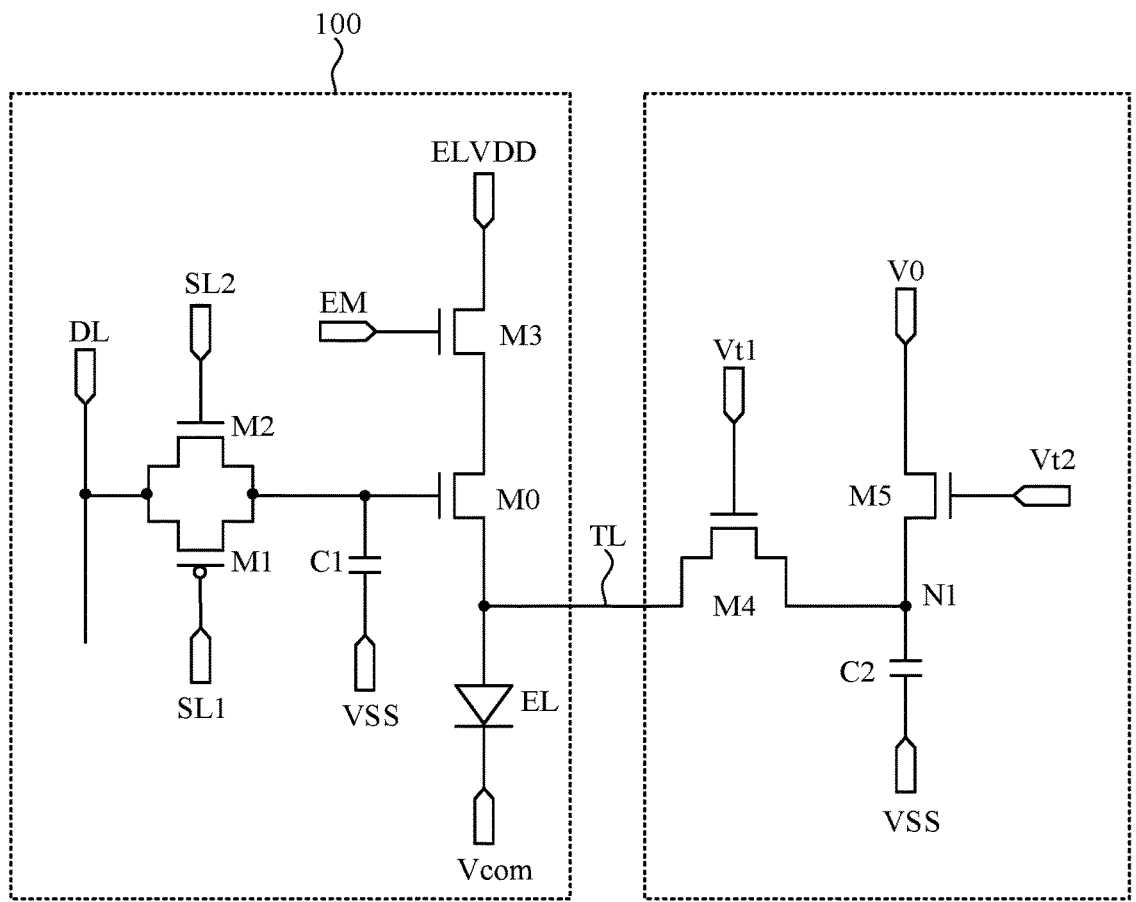
FIG. 5 is a diagram of an equivalent circuit of a detection circuit of a display substrate according to at least one embodiment of the present disclosure.

FIG. 5 is a diagram of an equivalent circuit of a detection circuit of a display substrate according to at least one embodiment of the present disclosure. In some exemplary embodiments, as shown in FIG. 5, the first control unit includes a fourth transistor M4, the second control unit includes a fifth transistor M5, and the memory unit includes a second storage capacitor C2. A control electrode of the fourth transistor M4 is connected with the first control terminal Vt1, a first electrode of the fourth transistor M4 is connected with the detection electrode, and a second electrode of the fourth transistor M4 is connected with the first node N1. A control electrode of the fifth transistor M5 is connected with the second control terminal Vt2, a first electrode of the fifth transistor M5 is connected with the first signal terminal V0, and a second electrode of the fifth transistor M5 is connected with the first node N1. A first electrode of the second storage capacitor C2 is connected with the first node N1, and a second electrode of the second storage capacitor C2 is connected with the first power terminal.

FIG. 5 illustrates an exemplary structure of a detection circuit. Those skilled in the art may easily understand that implementations of the detection circuit are not limited to this as long as its functions can be achieved.

Figure 6:
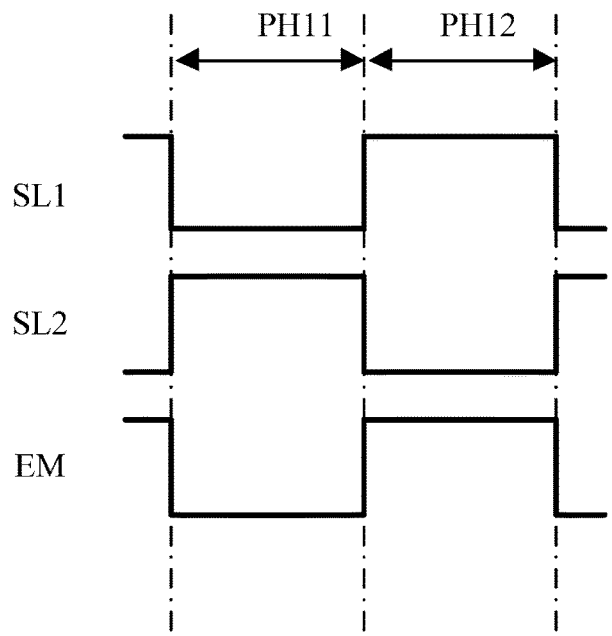
FIG. 6 is a working timing diagram of the pixel circuit provided in FIG. 5.

FIG. 6 is a working timing diagram of the pixel circuit provided in FIG. 5. Taking the first transistor M1 of the pixel circuit being a P-type transistor and the other transistors of the pixel circuit being N-type transistors as an example, the working process of the pixel circuit will be explained. As shown in FIG. 5, the pixel circuit according to this embodiment includes three switch transistors (including the first transistor M1, the second transistor M2, and the third transistor M3), a drive transistor (including the drive transistor M0), a capacitor unit (including the first storage capacitor C1), four signal input terminals (including the data line DL, the first scanning signal line SL1, the second scanning signal line SL2, and the light-emitting control line EM), and three power terminals (including the first power line ELVDD, the second power line VSS, and the third power line Vcom). For example, the first power line ELVDD provides a high level voltage, and the second power line VSS and the third power line Vcom provide a low level voltage, for example, both provide a ground voltage.

In some examples, in a display stage of sub-pixels, the pixel circuit in FIG. 5 works, but the detection circuit does not work. A display process of each frame image includes a data writing stage PH11 and a light emitting stage PH12.

In the data writing stage PH11, the first scanning signal line SL1 inputs a low level signal, the second scanning signal line SL2 inputs a high level signal, and the first transistor M1 and the second transistor M2 are both turned on to input the data signal provided by the data line DL into the control electrode of the drive transistor M0, and charge the first storage capacitor C1. The light-emitting control line EM inputs a low level signal, and the third transistor M3 is turned off.

In the light-emitting stage PH12, the first scanning signal line SL1 inputs a high level signal, the second scanning signal line SL2 inputs a low level signal, and both the first transistor M1 and the second transistor M2 are turned off. The light-emitting control line EM inputs a high level signal, and the third transistor M3 is turned on to supply the first power voltage input by the first power line ELVDD to the first electrode of the drive transistor M0. The drive transistor M0 is a source follower device. In the light-emitting process of the light-emitting element EL, the drive transistor M0 works in a subthreshold region, and controls the voltage of the first electrode of the light-emitting element EL in a source-following manner, thereby controlling the light-emitting state of the light-emitting element EL.

Figure 7:
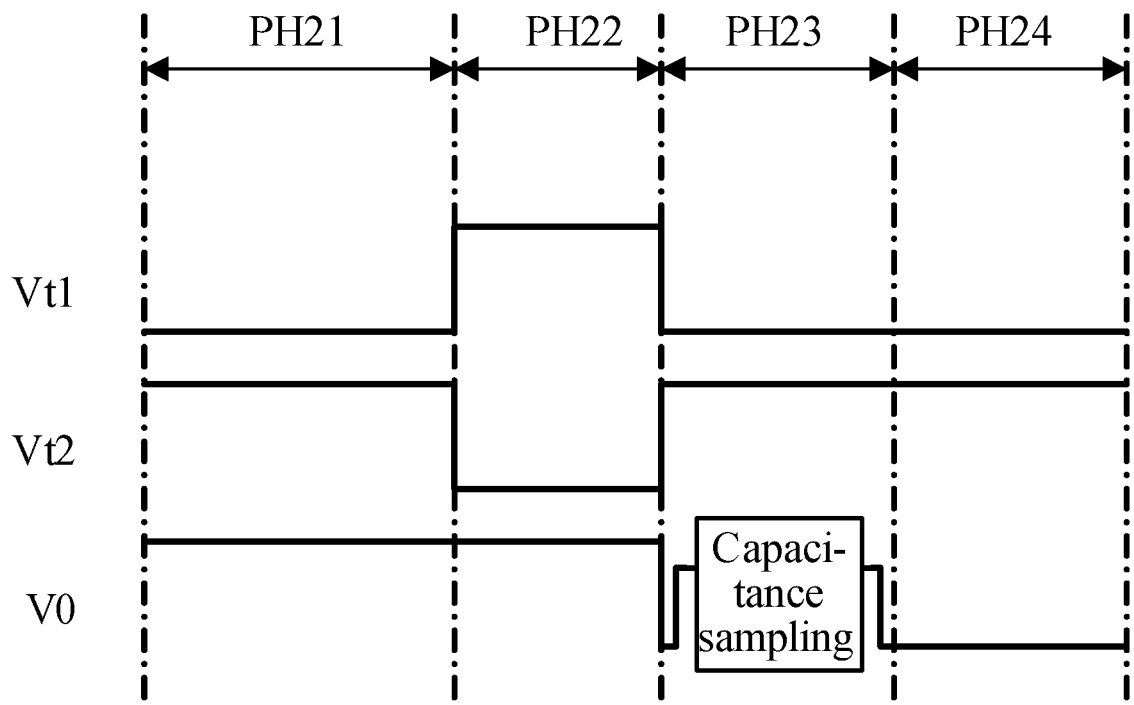
FIG. 7 is a working timing diagram of the detection circuit provided in FIG. 5.

FIG. 7 is a working timing diagram of the detection circuit provided in FIG. 5. Taking the fourth transistor M4 and the fifth transistor M5 of the detection circuit being N-type transistors as an example, the working process of the detection circuit will be explained. As shown in FIG. 5, the detection circuit according to this embodiment includes two switch transistors (including the fourth transistor M4 and the fifth transistor M5), a capacitor unit (including the second storage capacitor C2), three signal input terminals (including the first control terminal Vt1, the second control terminal Vt2 and the first signal terminal V0), a signal output terminal (including the first signal terminal V0), and a power terminal (including the first power terminal). The first signal terminal V0 serves as both a signal output terminal and a signal input terminal. For example, the first power terminal supplies a negative voltage (e.g., −3.5V) or a ground voltage.

In some examples, in a detection stage of the sub-pixel, the pixel circuit in FIG. 5 does not work, but the detection circuit works. As shown in FIG. 7, the detection process of at least one sub-pixel includes the following stages.

In a first sub-stage PH21 of the detection stage, the first control terminal Vt1 inputs a low level signal, the second control terminal Vt2 inputs a high level signal, the first signal terminal V0 inputs a high level signal (e.g., a high level DC signal), the fourth transistor M4 is turned off, and the fifth transistor M5 is turned on. At this stage, the connection between the first node N1 and the light-emitting element EL is disconnected, and the high level DC signal provided by the first signal terminal V0 may charge the second storage capacitor C2 until it reaches the high level VGH.

In a second sub-stage PH22 of the detection stage, the first control terminal Vt1 inputs a high level signal, the second control terminal Vt2 inputs a low level signal, the fourth transistor M4 is turned on, and the fifth transistor M5 is turned off. At this stage, it is conducted between the first node N1 and the light-emitting element EL, the second storage capacitor C2 may quickly discharge the light-emitting element EL of the pixel circuit, and the light-emitting element EL emits light and gradually darkens.

In some examples, as the discharge time of the second storage capacitor C2 increases, the voltage provided by the second storage capacitor C2 to the light-emitting element EL gradually decreases until it falls below a critical turn-on voltage of the light-emitting element EL, and the light-emitting element EL gradually darkens until it no longer emits light. In some examples, a scanning time length in the second sub-stage may be determined according to an emission threshold voltage of the light-emitting element EL. For example, when the emission threshold voltage of the light-emitting element is 4V and the voltage provided by the first power terminal is −3.5V, the time length required for discharging the second storage capacitor C2 to 0.5V may be set as the scanning time length. In some examples, when detecting an average current and equivalent resistance of the light-emitting element, a discharge time length in the second sub-stage may be controlled to be less than or equal to the scanning time length; and when detecting the critical turn-on voltage of the light-emitting element, a discharge time length in the second sub-stage may be controlled to be longer than the scanning time length.

In a third sub-stage PH23 of the detection stage, the first control terminal Vt1 inputs a low level signal, the second control terminal Vt2 inputs a high level signal, the fourth transistor M4 is turned off, and the fifth transistor M5 is turned on. At this stage, the connection between the first node N1 and the light-emitting element EL is disconnected, and it is conducted between the first node N1 and the first signal terminal V0, and the voltage of the second storage capacitor C2 is sampled through the first signal terminal V0.

In some examples, when the light-emitting element EL in the second sub-stage is still in the light-emitting state, it is switched to the third sub-stage, the voltage of the second storage capacitor C2 is sampled through the first signal terminal V0, which is denoted as Vc1, and then the average current $Iavg=(VGH-Vc1)*C2/t$ of the light-emitting element EL may be calculated, where t represents a discharge time length in the second sub-stage PH22, C2 represents a capacitance value of the second storage capacitor, and VGH represents a high voltage that the second storage capacitor is charged to in the first sub-stage. Then, the equivalent resistance $R=Vc1/Iavg$ of the light-emitting element EL may be calculated.

In some examples, when the light-emitting element EL in the second sub-stage is in a completely extinguished state, it is switched to the third sub-stage, the voltage of the second storage capacitor C2 is sampled through the first signal terminal V0, which is denoted as Vc2. Then, the critical turn-on voltage (i.e., threshold voltage) $Vth=Vc2$ of the light-emitting element EL may be calculated.

Figure 8:
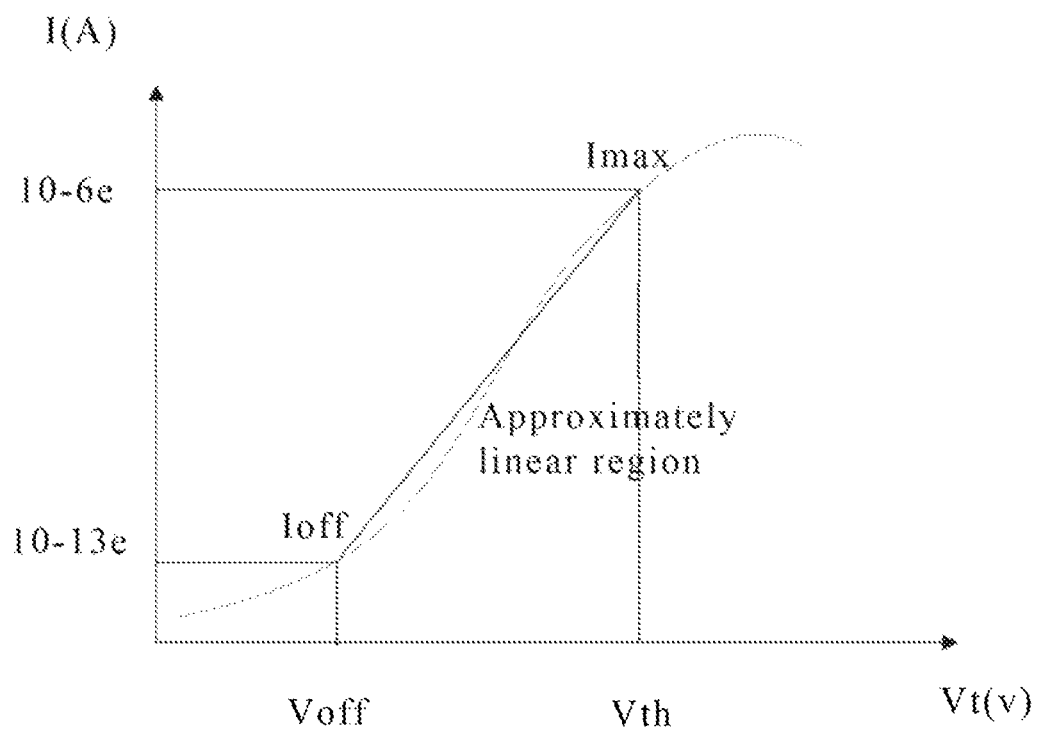
FIG. 8 is a schematic diagram of volt-ampere characteristics of a light-emitting element.

FIG. 8 is a schematic diagram of volt-ampere (V-A) characteristics of a light-emitting element. As shown in FIG. 8, an interval from an off-state current Ioff to an on-state current Ion of the light-emitting element is approximately defined as a linear region for calculation, and the on-state current $Ion=10-6$ eA, that is, the maximum current Imax, and the off-state current $Ioff=10-13$ eA. In some examples, taking the amplitude of two orders of magnitude as an example to define weak short and weak off states, when the current is greater than 10-4 eA, the light-emitting element is in a weak short state, and when the current is less than 10-11 eA and greater than 10-13 eA, the light-emitting element is in a weak off state. Based on the above results, a range of the equivalent resistance R of the light-emitting element may be calculated as follows: $R<Vth/(ion*100)$ when the light-emitting element is in the weak short state, and $Vth/Ioff>R>Vth/(Ioff*100)$ when the light-emitting element is in the weak off state. For example, if the threshold voltage Vth of the light-emitting element is 9.5V, the light-emitting element is in the weak short state when the equivalent resistance R of the light-emitting element is less than 95 KΩ, and the light-emitting element is in the weak off state when the equivalent resistance of the light-emitting element is in the following range: 95,000,000 MΩ>R>95,000 MΩ. Based on this, the equivalent resistance of the light-emitting element may be calculated by the voltage sampled in the third sub-stage, and then it may be detected whether the light-emitting element is in the weak short state or the weak off state according to the equivalent resistance of the light-emitting element.

In some exemplary embodiments, after the third sub-stage PH23 of the detection stage, the fourth sub-stage PH24 of the detection stage may be entered. In the fourth sub-stage PH24 of the detection stage, the first control terminal Vt1 inputs a low level signal, the second control terminal Vt2 inputs a high level signal, the fourth transistor M4 is turned off, and the fifth transistor M5 is turned on. At this stage, the connection between the first node N1 and the light-emitting element EL is disconnected, and it is conducted between the first node N1 and the first signal terminal V0, the first signal terminal V0 supplies a ground voltage, and the second storage capacitor C2 is discharged and reset through the first signal terminal V0.

In some exemplary embodiments, after the fourth sub-stage PH24 of the detection stage, the first sub-stage may be repeated, for example, the electrical performance of the light-emitting element is redetected; or, after the fourth sub-stage PH24, the display stage may be started instead of continuing the detection state. However, this is not limited in the present embodiment.

In the display substrate provided by this exemplary embodiment, the detection circuit is connected with the light-emitting element of the sub-pixel in the display region through the detection electrode provided in the detection region via the detection lead wire, and may detect the electrical performance of the light-emitting elements of the sub-pixels at different positions in the display region, thereby providing support for analysis of the defects of the display substrate.

Figure 9:
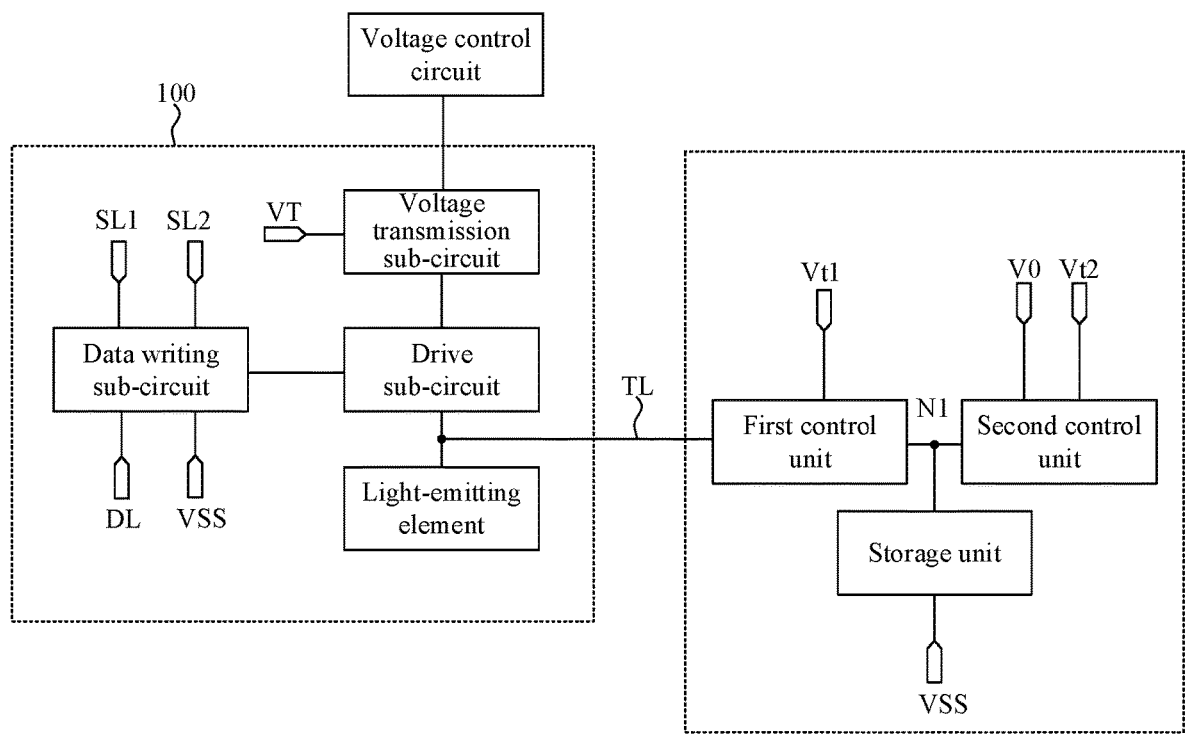
FIG. 9 is a schematic diagram of a pixel circuit and a detection circuit of a display substrate according to at least one embodiment of the present disclosure.

FIG. 9 is a schematic diagram of a pixel circuit and a detection circuit of a display substrate according to at least one embodiment of the present disclosure. In some exemplary embodiments, as shown in FIG. 9, the pixel circuit in this exemplary embodiment may include a drive sub-circuit, a voltage transmission sub-circuit and a data writing sub-circuit. The drive sub-circuit includes a control terminal, a first terminal and a second terminal. The voltage transmission sub-circuit is configured to respectively apply a reset voltage and a first power voltage to the first terminal of the drive sub-circuit in response to a transmission control signal. The data writing sub-circuit is configured to write a data signal into the control terminal of the drive sub-circuit and store the data signal that has been written in response to a first scanning signal and a second scanning signal. The drive sub-circuit is configured to drive the light-emitting element to emit light under control of the control terminal and the first terminal of the drive sub-circuit. The peripheral region is provided with a voltage control circuit which is connected with the pixel circuit. The voltage control circuit is configured to provide a reset voltage to the voltage transmission sub-circuit of the pixel circuit in response to a reset control signal and to provide a first power voltage to the voltage transmission sub-circuit in response to a light-emitting control signal.

Figure 10:
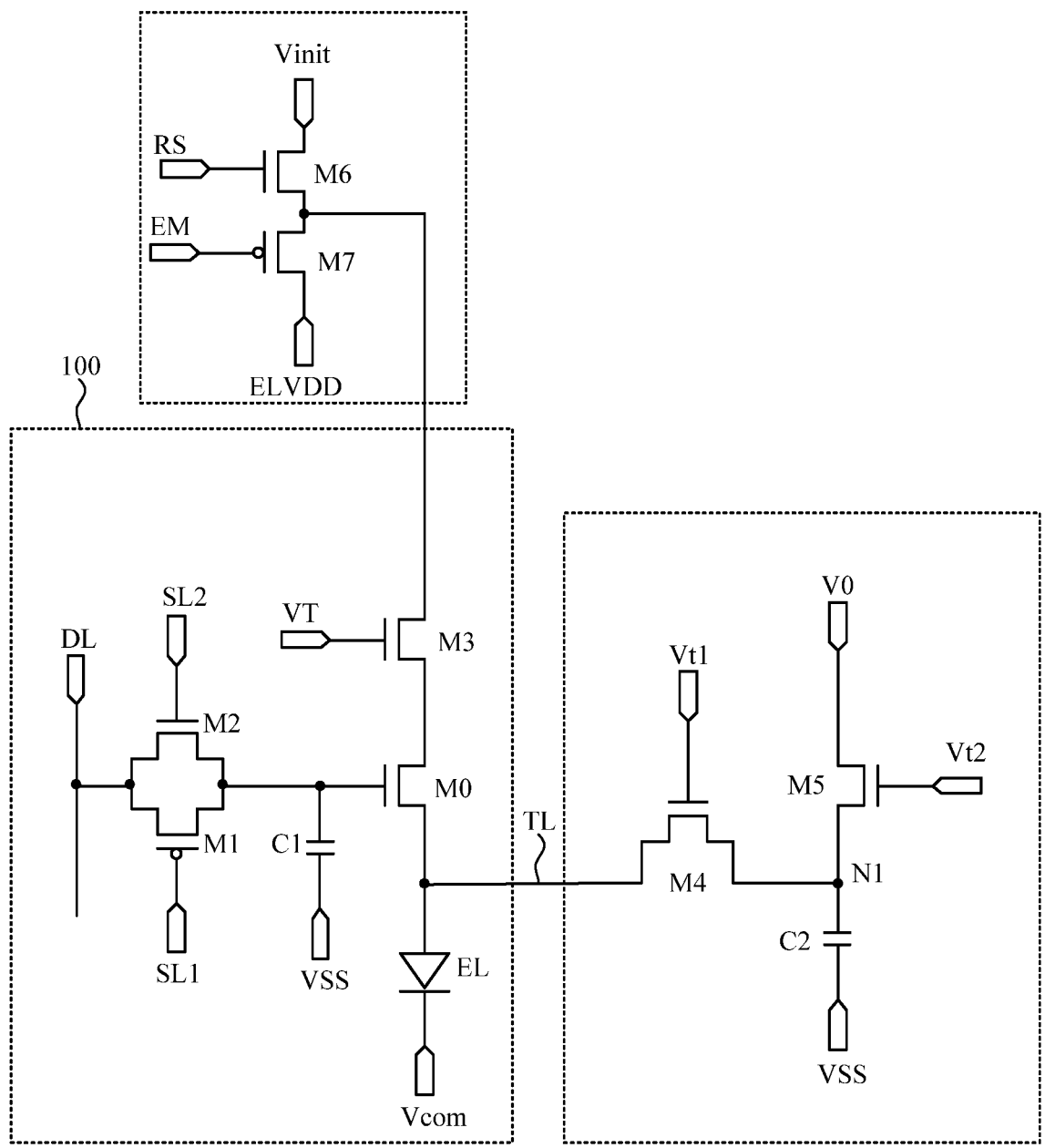
FIG. 10 is a diagram of an equivalent circuit of a pixel circuit and a detection circuit of a display substrate according to at least one embodiment of the present disclosure.

FIG. 10 is a diagram of an equivalent circuit of a pixel circuit and a detection circuit of a display substrate according to at least one embodiment of the present disclosure. In some exemplary embodiments, as shown in FIG. 10, the drive sub-circuit includes a drive transistor M0. The data writing sub-circuit includes a first transistor M1, a second transistor M2 and a first storage capacitor C1. The voltage transmission sub-circuit includes a third transistor M3. The voltage control circuit includes a sixth transistor M6 and a seventh transistor M7. A control electrode of the drive transistor M0 is connected with a control terminal of the drive sub-circuit, a first electrode of the drive transistor M0 is connected with a first terminal of the drive sub-circuit, and a second electrode of the drive transistor M0 is connected with a second terminal of the drive sub-circuit. A control electrode of the first transistor M1 is connected with a first scanning signal line SL1, a first electrode of the first transistor M1 is connected with a data line DL, and a second electrode of the first transistor M1 is connected with a control electrode of the drive transistor M0. A control electrode of the second transistor M2 is connected with a second scanning signal line SL2, a first electrode of the second transistor M2 is connected with the data line DL, and a second electrode of the second transistor M2 is connected with the control electrode of the drive transistor M0. A control electrode of the third transistor M3 is connected with a transmission control line VT, a first electrode of the third transistor M3 is connected with a second electrode of the sixth transistor M6 and a first electrode of the seventh transistor M7, and a second electrode of the third transistor M3 is connected with a first electrode of the drive transistor M0. A first electrode of the first storage capacitor C1 is connected with the control electrode of the drive transistor M0, and a second electrode of the first storage capacitor C1 is connected with a second power line VSS. A control electrode of the sixth transistor M6 is connected with a reset control line RS, and a first electrode of the sixth transistor M6 is connected with a reset voltage line Vinit. A control electrode of the seventh transistor M7 is connected with a light-emitting control line EM, and a second electrode of the seventh transistor M7 is connected with a first power line ELVDD. A first electrode of the light-emitting element EL is connected with the second electrode of the drive transistor M0, and a second electrode of the light-emitting element EL is connected with a third power line Vcom.

In some exemplary embodiments, the first transistor M1 and the seventh transistor M7 are P-type transistors, and the driving transistor M0, the second transistor M2, the third transistor M3, and the sixth transistor M6 are N-type transistors. However, this is not limited in the present embodiment.

In some exemplary embodiments, taking the first transistor M1 of the pixel circuit and the seventh transistor M7 of the voltage control circuit being P-type transistors and other transistors of the pixel circuit being N-type transistors as an example, the working process of the pixel circuit will be explained. For example, in a display stage of sub-pixels, in FIG. 10, the pixel circuit works, but the detection circuit does not work. The display process of each frame image includes a reset stage, a data writing stage, a light-emitting stage and a non-light-emitting stage.

In the reset stage, the reset control line RS inputs a high level signal and the sixth transistor M6 is turned on; the transmission control line VT inputs a high level signal, and the third transistor M3 is turned on; the light-emitting control line EM inputs a high level signal, and the seventh transistor M7 is turned off. The first scanning signal line SL1 inputs a high level signal, the second scanning signal line SL2 inputs a low level signal, and both the first transistor M1 and the second transistor M2 are turned off. In the reset stage, the light-emitting element EL is reset with a low potential (for example, a ground voltage) provided by the reset voltage line Vinit.

In the data writing stage, the first scanning signal line SL1 inputs a low level signal, the second scanning signal line SL2 inputs a high level signal, the first transistor M1 and the second transistor M2 are both turned on to input the data signal provided by the data line DL to the control electrode of the drive transistor M0, and charge the first storage capacitor C1. The reset control line RS inputs a low level signal, the sixth transistor M6 is turned off, the light-emitting control line EM inputs a high level signal, and the seventh transistor M7 is turned off. The transmission control line VT inputs a low level signal, and the third transistor M3 is turned off.

In the light-emitting stage, the first scanning signal line SL1 inputs a high level signal, the second scanning signal line SL2 inputs a low level signal, and both the first transistor M1 and the second transistor M2 are turned off. The light-emitting control line EM inputs a low level signal, the seventh transistor M7 is turned on, the reset control line RS inputs a low level signal, and the sixth transistor M6 is turned off. The transmission control line VT inputs a high level signal, and the third transistor M3 is turned on. The first power voltage supplied by the first power line ELVDD is applied to the first electrode of the drive transistor M0 through the sixth transistor M6 and the third transistor M3.

In the non-light-emitting stage, the transmission control line VT inputs a low level signal, and the third transistor M3 is turned off, so that the first power voltage cannot be applied to the first electrode of the drive transistor M0, thereby stopping the light-emitting element EL from emitting light.

The structure and working mode of the detection circuit in FIGS. 9 and 10 may be referred to the description of the above embodiments and will not be further illustrated here.

The technical solution of this embodiment is described below by an example of a preparation process of a display substrate. "The patterning process" mentioned in the embodiment, including processings, such as deposition of a film layer, coating of photoresist, mask exposure, development, etching, stripping of photoresist, is known mature preparation processes. Deposition may be performed by using a known process such as sputtering, evaporation, chemical vapor deposition, or the like, coating may be performed by using a known coating process, and etching may be performed by using a known approach, which are not limited here. In the description of this embodiment, it should be understood that "thin film" refers to a layer of thin film manufactured through a certain material on a substrate by using a deposition or coating process. If a patterning process or a photolithography process is not needed for the "thin film" during the whole manufacturing process, the "thin film" may also be referred to as a "layer". If a patterning process or a photolithography process is needed for the "thin film" during the whole manufacturing process, it is referred to as a "thin film" before the patterning process and referred to as a "layer" after the patterning process. The "layer" after the patterning process or photolithography process includes at least one "pattern". In the present disclosure, "A and B are provided on the same layer" means that A and B are formed at the same time by the same patterning process.

In some exemplary embodiments, it will be illustrated with the case where the sub-pixel provided in the display region has the pixel circuit shown in FIG. 5, and the detection region is provided with a detection electrode connected with the sub-pixel through a detection lead wire, as an example. In this example, the detection circuit is provided on an external circuit board, and the detection circuit is connected with the light-emitting elements of corresponding sub-pixels in the display region through the detection electrode and the detection lead wire. In the following, it will be illustrated with the case where the first transistor M1 of the pixel circuit in the display region is a P-type transistor, the second transistor M2, the third transistor M3, and the drive transistor M0 are N-type transistors, as an example.

A process for preparing a display substrate of the present exemplary embodiment may include following actions.

(1) Forming an active layer and a first conductive layer on a base substrate.

Figure 11:
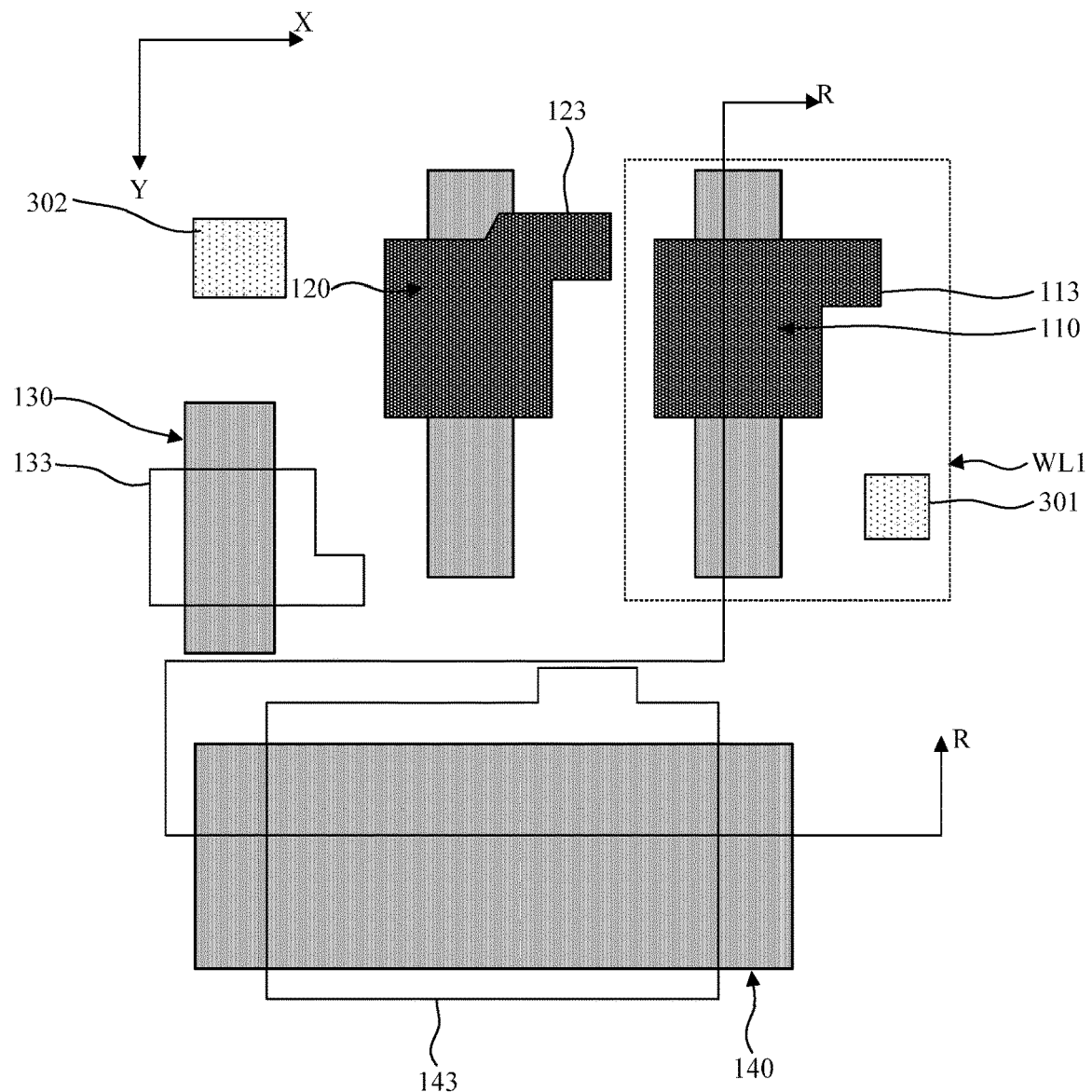
FIG. 11 is a schematic diagram of a display substrate after an active layer and a first conductive layer are formed according to at least one embodiment of the present disclosure.

In some exemplary embodiments, a silicon-based base substrate is provided, for example, its material is P-type monocrystalline silicon. An N-type transistor (such as a drive transistor) may be directly manufactured on a P-type base, that is, the P-type base serves as a channel region of the N-type transistor, which is conducive to giving full play to the advantages of high speed of NMOS devices and improving circuit performance. As shown in FIG. 11, N-type doping is performed on the P-type silicon-based base substrate to form an N-type well region WL1 as the base of the first transistor M1 (i.e., P-type transistor).

Figure 12:
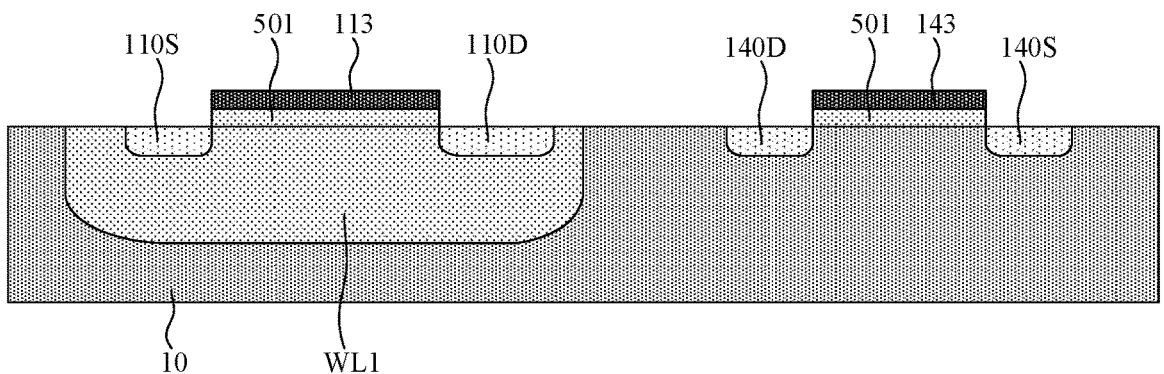
FIG. 12 is a schematic sectional view along R-R direction in FIG. 11.

In some exemplary embodiments, a first insulating layer 501 is formed on the base substrate 10, and then a first conductive layer is formed on the first insulating layer 501 by a patterning process, as shown in FIGS. 11 and 12. For example, a first insulating layer is formed on the base substrate by thermal oxidation, and a material of the first insulating layer may be silicon nitride, oxide or oxynitride; and then, a first conductive material layer is formed on the first insulating layer, and the first conductive layer is formed by performing photolithography process on the first conductive material layer. A material of the first conductive layer may be polysilicon material. The first insulating layer 501 may be referred to as a gate insulating layer. As shown in FIG. 11, the first conductive layer at least includes a control electrode 113 of the first transistor M1, a control electrode 123 of the second transistor M2, a control electrode 133 of the third transistor M3 and a control electrode 143 of the drive transistor M0.

In some exemplary embodiments, the base substrate on which the first conductive layer is formed is heavily doped to form a doped region for electrical connection on the base substrate. As shown in FIGS. 11 and 12, the doped region for electrical connection includes a source region 110S and a drain region 110D of an active region 110 of the first transistor M1, a source region and a drain region of an active region 120 of the second transistor M2, a source region and a drain region of an active region 130 of the third transistor M3, a source region 140S and a drain region 140D of an active region 140 of the drive transistor M0, a first contact region 301 in the N-type well region WL1, and a second contact region 302 in the P-type base. The active region 140 of the drive transistor M0 extends along a first direction X. The active region 110 of the first transistor M1, the active region 120 of the second transistor M2 and the active region 130 of the third transistor M3 extend along a second direction Y. The first direction X is perpendicular to the second direction Y. The first transistor M1, the second transistor M2 and the third transistor M3 are sequentially arranged along the first direction X. The first transistor M1, the second transistor M2 and the third transistor M3 are arranged on one side of the drive transistor M0 along the second direction Y.

For example, in the doping process, N-type doping and P-type doping may be performed separately, for example, to form the source and drain regions of the N-type transistor and the source and drain regions of the P-type transistor. When the N-type doping process is performed, a barrier layer may be formed to shield a region that is not N-type doped; and when the P-type doping process is performed, a barrier layer may be formed to shield a region that is not P-type doped. The barrier layer may be made of nitride, oxide or oxynitride of silicon, or may be a photoresist material. After the doping process is finished, the barrier layer may remain in the display substrate or may be removed. The N-type doping process may be, for example, an ion implantation process, and the doping element may be, for example, boron. The P-type doping process may be, for example, an ion implantation process, and the doping element may be, for example, phosphorus.

(2) Sequentially forming a second insulating layer and a second conductive layer on the base substrate.

Figure 13:
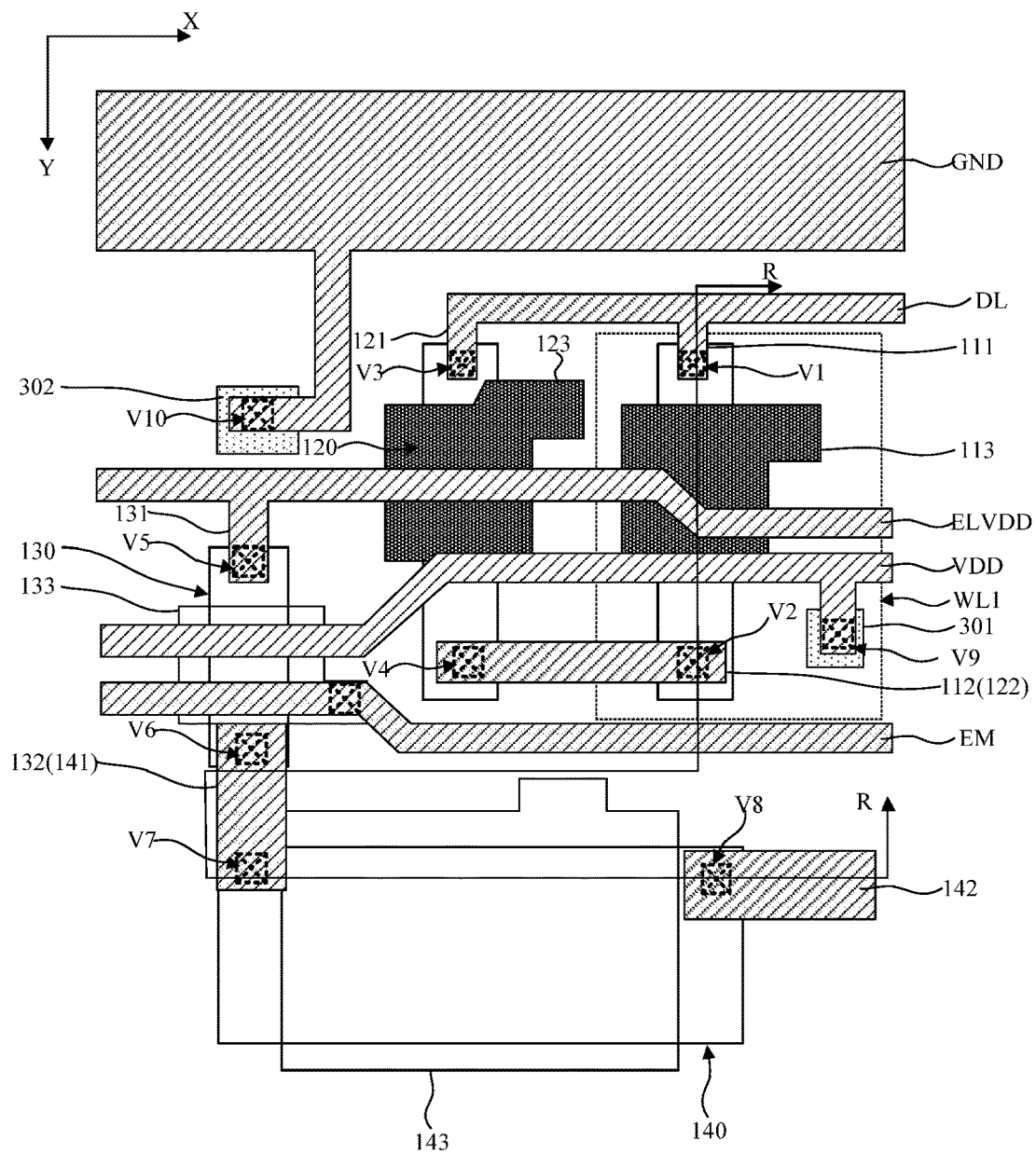
FIG. 13 is a schematic diagram of a display structure after a second conductive layer is formed according to at least one embodiment of the present disclosure.
Figure 14:
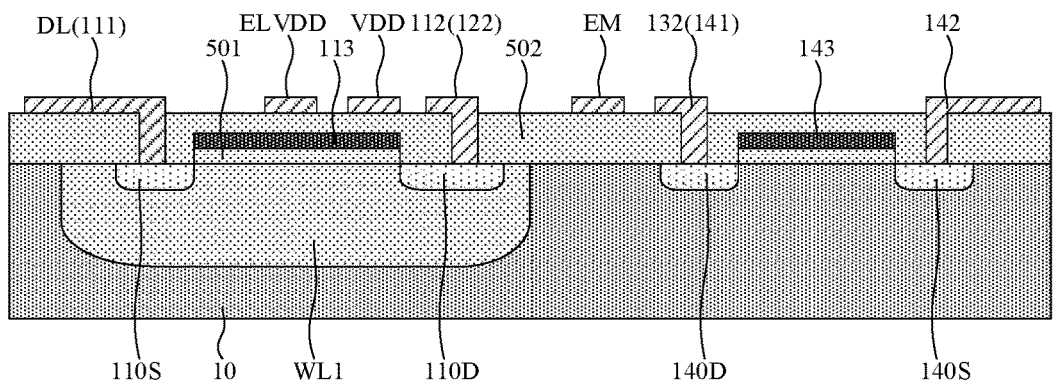
FIG. 14 is a schematic sectional view R-R direction in FIG. 13.

In some exemplary embodiments, a second insulating layer 502 is formed on the base substrate 10, and then a second conductive layer is formed on the second insulating layer 502, as shown in FIGS. 13 and 14. A material of the second conductive layer 502 may be metal material. The second conductive layer 502 may also be referred to as a first metal layer. A plurality of via holes are provided on the second insulating layer 502. The plurality of via holes at least includes a first via hole V1 to a tenth via hole V10. The first insulating layer 501 and the second insulating layer 502 in the plurality of via holes are all removed.

As shown in FIG. 13, the second conductive layer at least includes a first power line ELVDD, a fourth power line VDD, a ground line GND, a light-emitting control line EM, a data line DL, a first electrode 111 and a second electrode 112 of a first transistor M1, a first electrode 121 and a second electrode 122 of a second transistor M2, a first electrode 131 and a second electrode 132 of a third transistor M3, and a first electrode 141 and a second electrode 141 of a drive transistor M0. In this example, both a second power line VSS and a third power line Vcom provide a ground voltage, that is, both the second power voltage and the third power voltage may be provided by the ground line GND. The second electrode 112 of the first transistor M1 is integrated with the second electrode 122 of the second transistor M2. The first electrode 111 of the first transistor M1 and the first electrode 121 of the second transistor M2 are integrated with the data line DL. The first electrode 131 of the third transistor M3 is integrated with the first power line ELVDD, and the second electrode 132 of the third transistor M3 is integrated with the first electrode 141 of the drive transistor M0. The fourth power line VDD provides a high-level voltage, for example, 5V.

In some exemplary embodiments, as shown in FIGS. 13 and 14, the first electrode 111 of the first transistor M1 is electrically connected with a source region 110S of the active region 110 of the first transistor M1 through the first via hole V1, and the second electrode 112 of the first transistor M2 is electrically connected with a drain region 110D of the active region 110 of the first transistor M1 through the second via hole V2. The first electrode 121 of the second transistor M2 is electrically connected with a drain region of the active region 110 of the second transistor M2 through the third via hole V3, and the second electrode 122 of the second transistor M2 is electrically connected with the drain region of the active region 110 of the second transistor M2 through the fourth via hole V4. The first electrode 131 of the third transistor M3 is electrically connected with a source region of the active region 130 of the third transistor M3 through the fifth via hole V5, and the second electrode 132 of the third transistor M3 is electrically connected with a drain region of the active region 130 of the third transistor M3 through the sixth via hole V6. The first electrode 141 of the drive transistor M0 is electrically connected with a drain region 140D of the active region 140 of the drive transistor M0 through a seventh via hole V7, and the second electrode 142 of the drive transistor M0 is electrically connected with a source region 140S of the active region 140 of the drive transistor M0 through the eighth via hole V8.

In some exemplary embodiments, as shown in FIG. 13, an orthographic projection of the first power line ELVDD on the base substrate is located between an orthographic projection of the fourth power line VDD on the base substrate and an orthographic projection of the data line DL on the base substrate, and an orthographic projection of the light-emitting control line EM on the base substrate is located on a side of an orthographic projection of the fourth power line VDD on the base substrate far away from the first power line ELVDD. Partial extending directions of the first power line ELVDD, the fourth power line VDD, the data line DL and the light-emitting control line EM are parallel to a first direction X. The fourth power line VDD has a bending region when extending along the first direction X. In addition, the light-emitting control line EM also has a bending region when extending along the first direction X, and a bending direction of the bending region of the fourth power line VDD is different from that of the light-emitting control line EM. A layout space may be reserved for the second electrode 112 of the first transistor M1 by adopting this wiring mode.

In some exemplary embodiments, as shown in FIG. 13, the fourth power line VDD is connected with the first contact region 301 through the ninth via hole V9, and the ground line GND is connected with the second contact region 302 through the tenth via hole V10. An N-type well region WL1 where the first transistor M1 is located may be biased by connecting the first contact region 301 with the fourth power line VDD, and a P-type base where the second transistor M2 is located may be biased by connecting the second contact region 302 with the ground line GND. In this example, by low-voltage biasing the P-type base and high-voltage biasing the N-type well region 301, a parasitic PN junction between them may be reversed, the devices can be electrically isolated, the parasitic effect between the devices can be reduced, and the stability of the circuit can be improved.

(3) Sequentially forming a third insulating layer and a third conductive layer on the base substrate.

Figure 15:
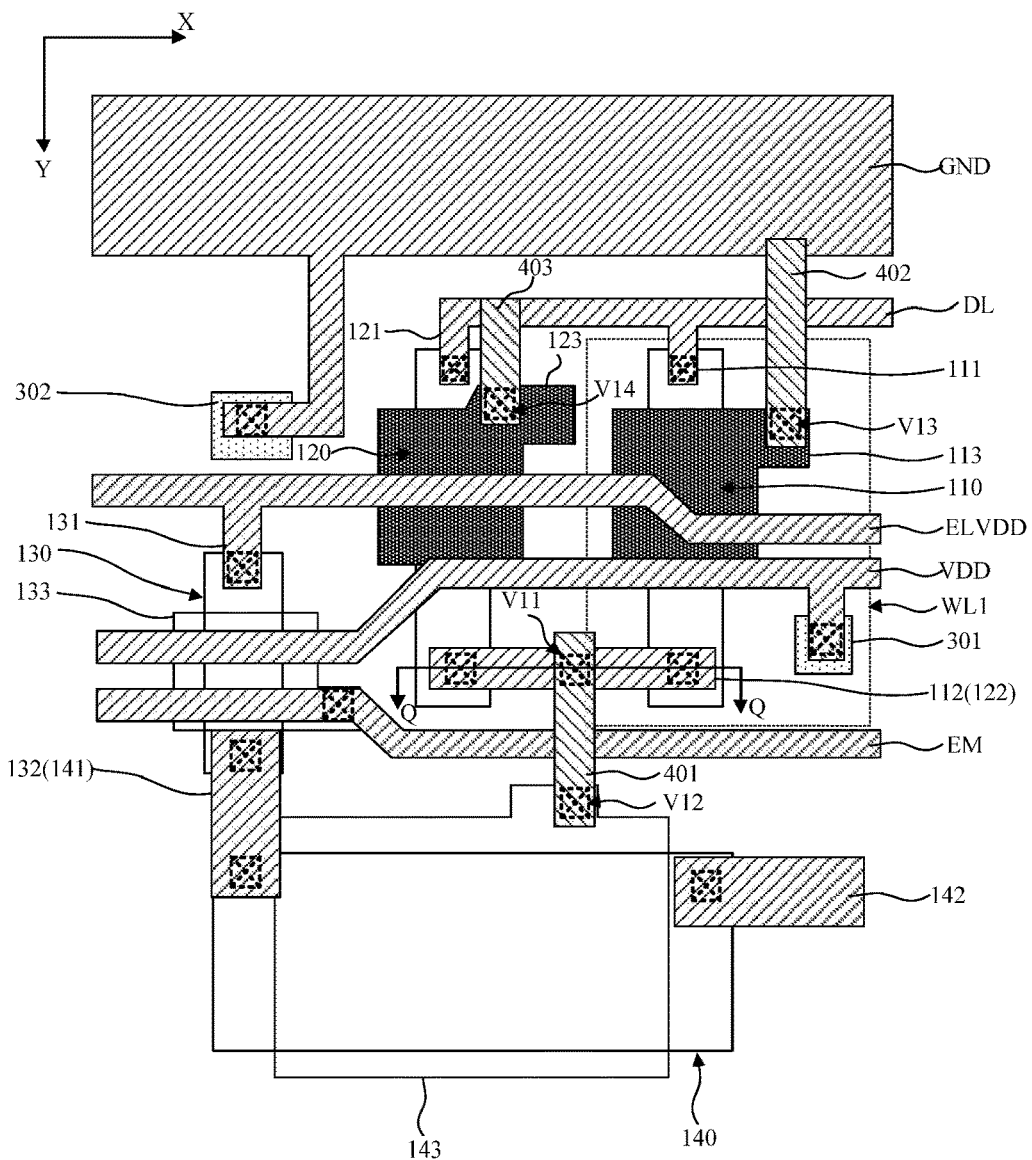
FIG. 15 is a schematic diagram of a display substrate after a third conductive layer is formed according to at least one embodiment of the present disclosure.
Figure 16:
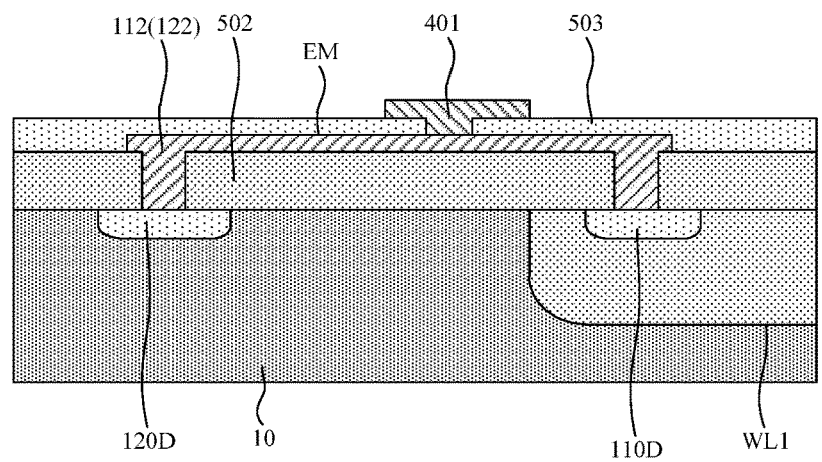
FIG. 16 is a schematic sectional view along Q-Q direction in FIG. 15.

In some exemplary embodiments, the third insulating layer 503 and the third conductive layer are sequentially formed on the base substrate 10 on which the aforementioned structure is formed, as shown in FIGS. 15 and 16. A plurality of via holes are provided on the third insulating layer 503, and the plurality of via holes at least include: an eleventh via hole V11 exposing the second electrode 112 of the first transistor M1, a twelfth via hole V12 exposing the control electrode 140 of the drive transistor M0, a thirteenth via hole V13 exposing the control electrode 113 of the first transistor M1, and a fourteenth via hole V14 exposing the control electrode 123 of the second transistor M2.

As shown in FIG. 15, the third conductive layer at least includes a first adapter electrode 401, a second adapter electrode 402 and a third adapter electrode 403. Extending directions of the first adapter electrode 401, the second adapter electrode 402 and the third adapter electrode 403 are parallel to a second direction Y. The first adapter electrode 401 is connected with the second electrode 112 of the first transistor M1 through the eleventh via hole V11, and connected with the control electrode 143 of the drive transistor M0 through the twelfth via hole V12, thus realizing the electrical connections of the second electrode 112 of the first transistor M1, the second electrode 122 of the second transistor M2 and the control electrode 143 of the drive transistor M0. The second adapter electrode 402 is connected with the control electrode 113 of the first transistor M1 through the thirteenth via hole V13. The third adapter electrode 403 is connected with the control electrode 123 of the second transistor M2 through the fourteenth via hole V14.

(4) Sequentially forming a fourth insulating layer and a fourth conductive layer on the base substrate.

Figure 17:
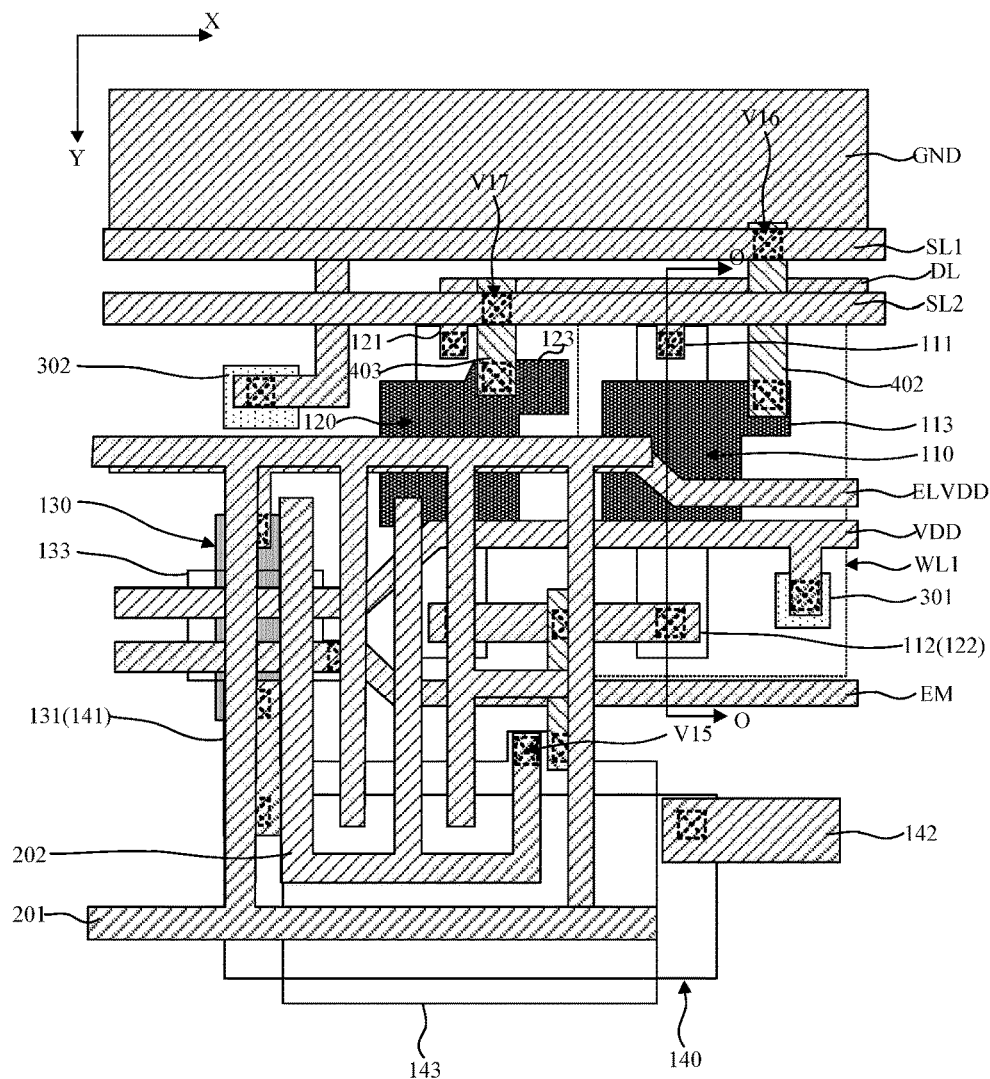
FIG. 17 is a schematic diagram of a display substrate after a fourth conductive layer is formed according to at least one embodiment of the present disclosure.
Figure 18:
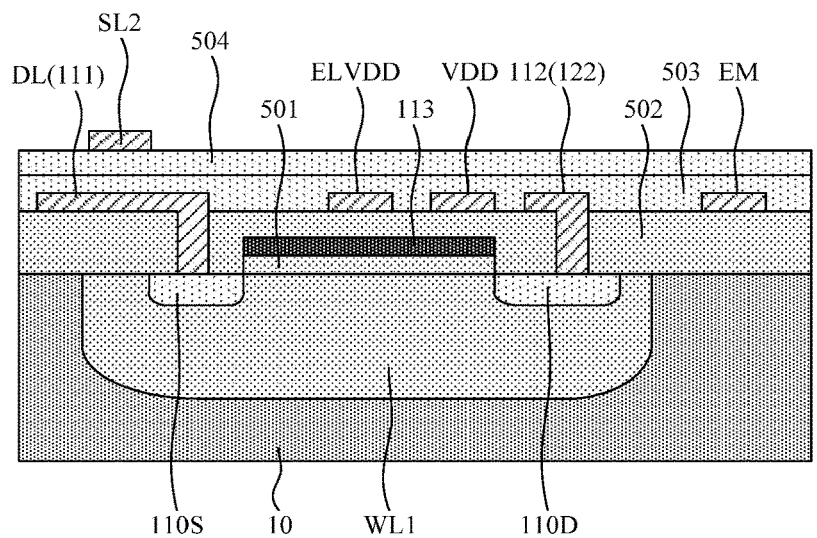
FIG. 18 is a schematic sectional view along O-O direction in FIG. 17.

In some exemplary embodiments, the fourth insulating layer 504 and the fourth conductive layer are sequentially formed on the base substrate 10 on which the aforementioned structure is formed, as shown in FIGS. 17 and 18. A plurality of via holes are provided on the fourth insulating layer 504, and the plurality of via holes at least include a fifteenth via hole V15 exposing the control electrode 143 of the drive transistor M0, a sixteenth via hole V16 exposing the second adapter electrode 402, and a seventeenth via hole V17 exposing the third adapter electrode 403. The fourth conductive layer at least includes a first scanning signal line SL1, a second scanning signal line SL2, and a first electrode 201 and a second electrode 202. The first electrode 201 includes a plurality of strip electrodes, and the second electrode 202 includes a plurality of strip electrodes. The plurality of strip electrodes of the first electrode 201 and the plurality of strip electrodes of the second electrode 202 are alternately arranged with each other, and a first sub-capacitor is formed by the first electrode 201, the second electrode 202, and a space portion therebetween. The first electrode 201 serves as a first electrode of the first sub-capacitor, and the second electrode 202 serves as a second electrode of the first sub-capacitor. For example, the first sub-capacitor is a portion of a first storage capacitor C1, and the first sub-capacitor and a second sub-capacitor hereinafter are connected in parallel to form the first storage capacitor C1.

In some exemplary embodiments, as shown in FIG. 17, an orthographic projection of the second scanning signal line SL2 on the base substrate at least partially overlaps with an orthographic projection of the data line DL on the base substrate. In this exemplary embodiment, by overlapping the second scanning signal line SL2 with the data line DL in a direction perpendicular to the base substrate, the data line DL may not occupy additional layout area, so that the layout area occupied by the display substrate can be further reduced, which is more conducive to achieving high PPI.

In some exemplary embodiments, as shown in FIG. 17, an orthographic projection of the first power line ELVDD on the base substrate is located between an orthographic projection of the second scanning signal line SL2 on the base substrate and an orthographic projection of the light-emitting control line EM on the base substrate. Since a first power voltage transmitted by the first power line ELVDD is a DC signal, and both the second scanning signal transmitted by the second scanning signal line SL2 and the light-emitting control signal transmitted by the light-emitting control line EM are jump signals, the above arrangement may effectively shield the mutual interference between the second scanning signal and the light-emitting control signal.

(5) Sequentially forming a fifth insulating layer, a fifth conductive layer, a sixth insulating layer, a sixth conductive layer, a seventh insulating layer and a seventh conductive layer on the base substrate.

In some exemplary embodiments, the fifth insulating layer 505, the fifth conductive layer, the sixth insulating layer 506, the sixth conductive layer, the seventh insulating layer 507, and the seventh conductive layer are sequentially formed on the base substrate on which the aforementioned structure is formed, as shown in FIGS. 19 to 22.

Figure 19:
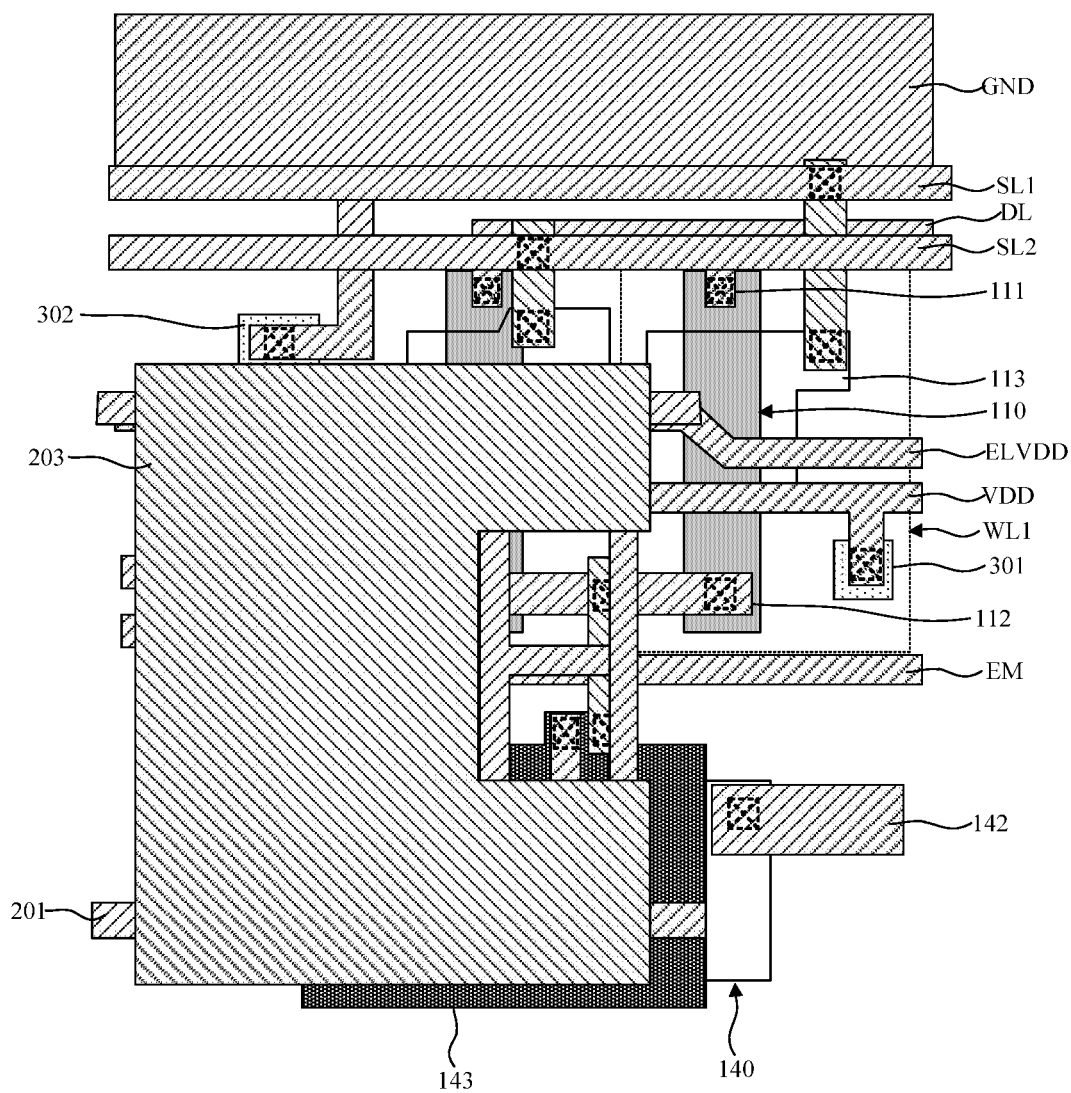
FIG. 19 is a schematic diagram of a display substrate after a fifth conductive layer is formed according to at least one embodiment of the present disclosure.

As shown in FIG. 19, the fifth conductive layer at least includes a third electrode 203, for example, the third electrode 203 is a planar electrode, and acts as a first electrode of a second sub-capacitor.

Figure 20:
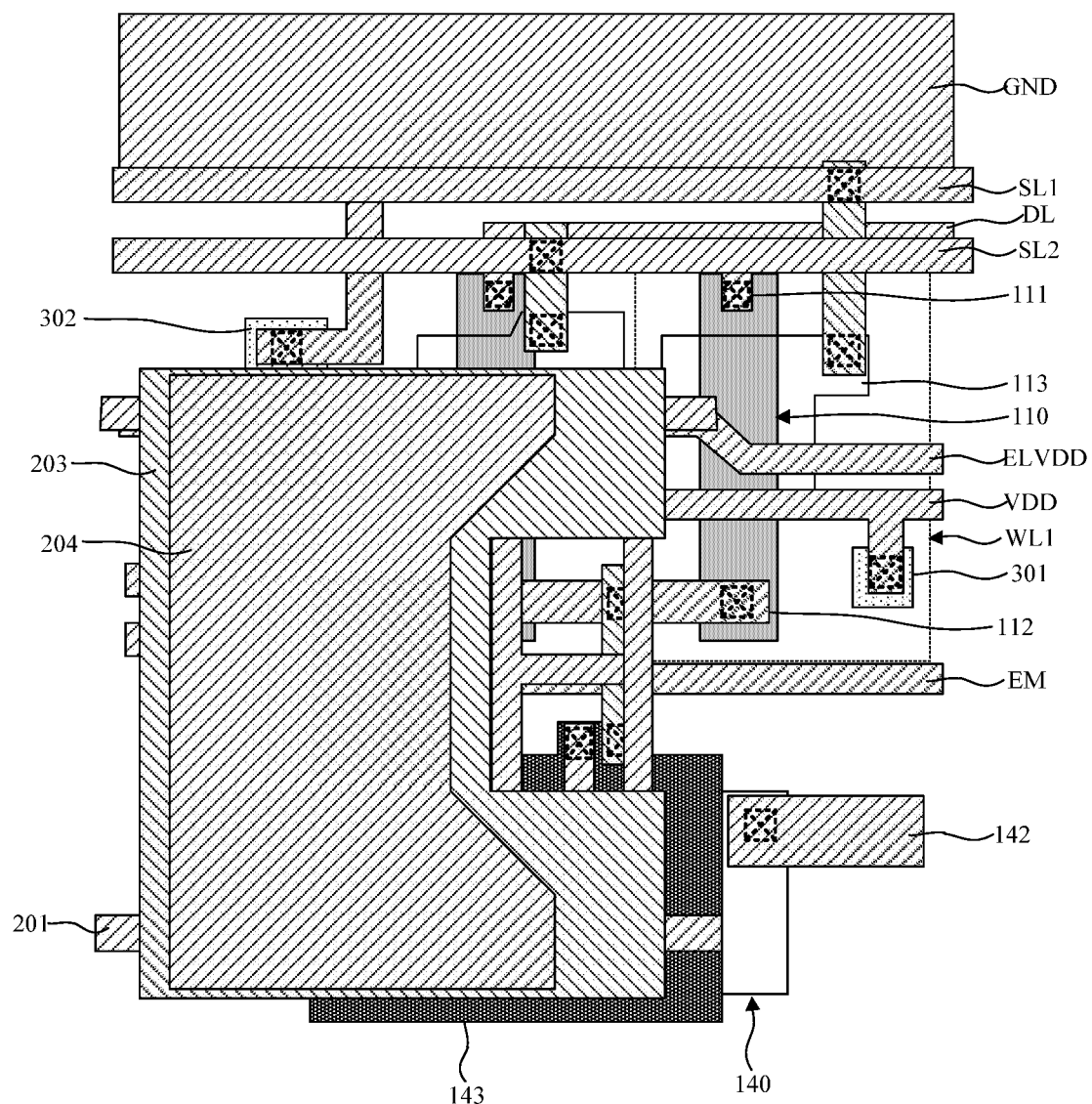
FIG. 20 is a schematic diagram of a display substrate after a sixth conductive layer is formed according to at least one embodiment of the present disclosure.

As shown in FIG. 20, the sixth conductive layer at least includes a fourth electrode 204, for example, the fourth electrode 204 is a planar electrode, and acts as a second electrode of the second sub-capacitor. The second sub-capacitor C12 is formed by the third electrode 203, the fourth electrode 204, and a space portion therebetween.

Figure 21:
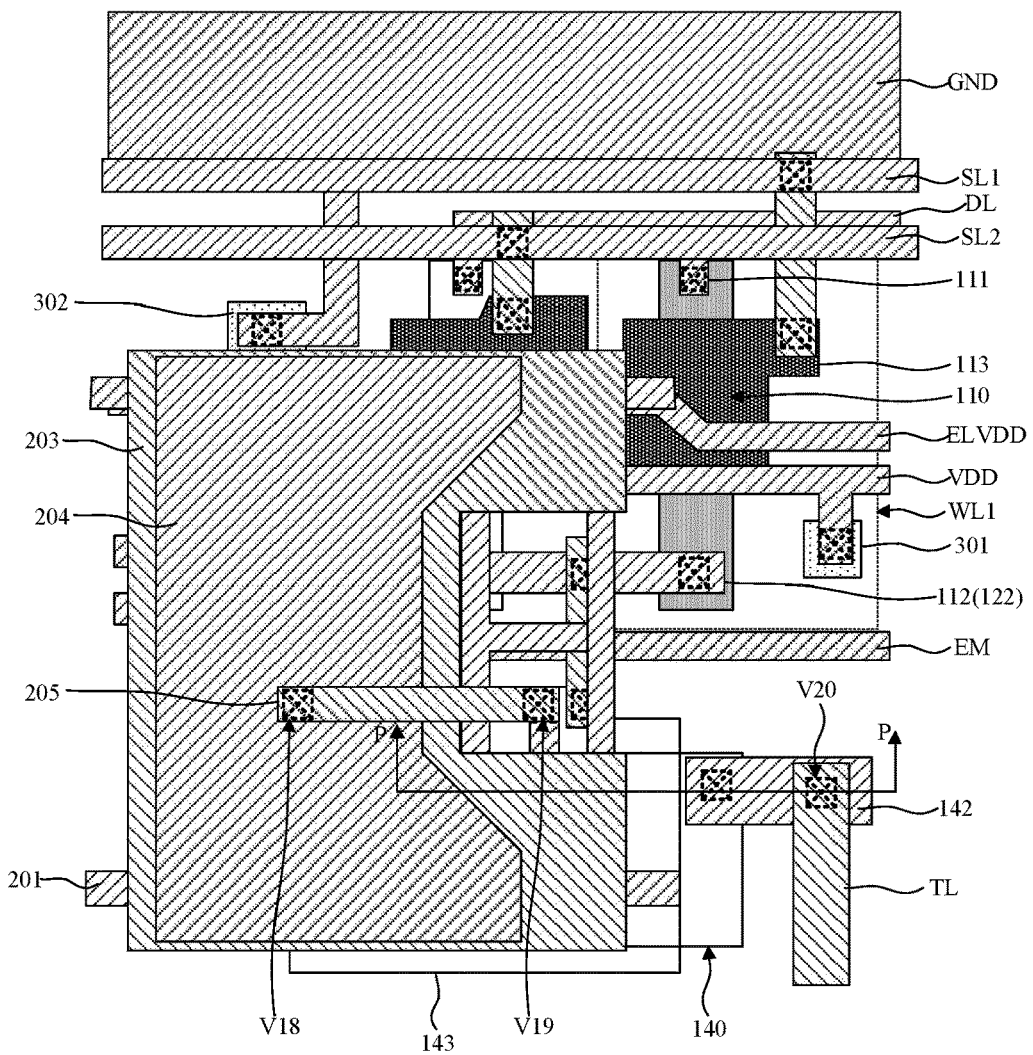
FIG. 21 is a schematic diagram of a display substrate after a seventh conductive layer is formed according to at least one embodiment of the present disclosure.
Figure 22:
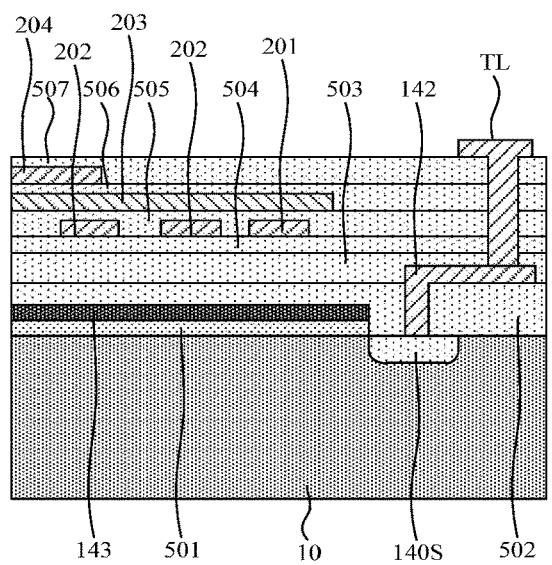
FIG. 22 is a schematic sectional view along P-P direction in FIG. 21.

As shown in FIGS. 21 and 22, the seventh insulating layer at least includes: an eighteenth via hole V18 exposing the fourth electrode 204, a nineteenth via hole V19 exposing the first electrode 201, and a twentieth via hole V20 exposing the second electrode 142 of the drive transistor M0. The seventh conductive layer at least includes a fourth adapter electrode 205 and a detection lead wire TL. The fourth adapter electrode 205 is connected with the fourth electrode 204 through the eighteenth via hole V18, and connected with the first electrode 201 through the nineteenth via hole V19, thereby realizing the electrical connection among the control electrode 143 of the drive transistor 140, the first electrode of the first sub-capacitor and the second electrode of the second sub-capacitor. The second electrode 202 and the third electrode 203 are configured to receive a second power voltage, for example, a ground voltage.

As shown in FIGS. 21 and 22, the detection lead wire TL is connected with the second electrode 142 of the drive transistor M0 through the twentieth via hole V20. The detection lead wire TL extends from the display region to the detection region so as to be electrically connected with the detection electrode in the detection region.

(6) Forming an eighth insulating layer and an eighth conductive layer on the base substrate.

Figure 23:
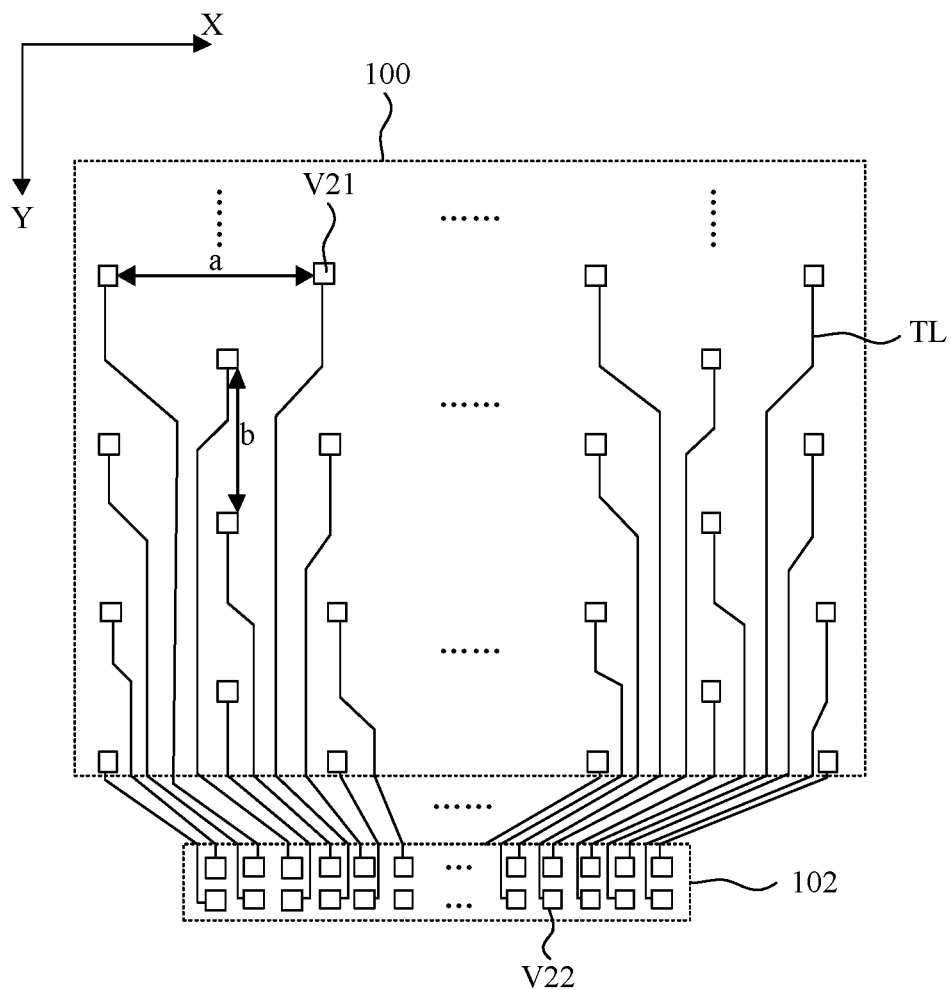
FIG. 23 is a schematic diagram of a display substrate after an eighth conductive layer is formed according to at least one embodiment of the present disclosure.
Figure 24:
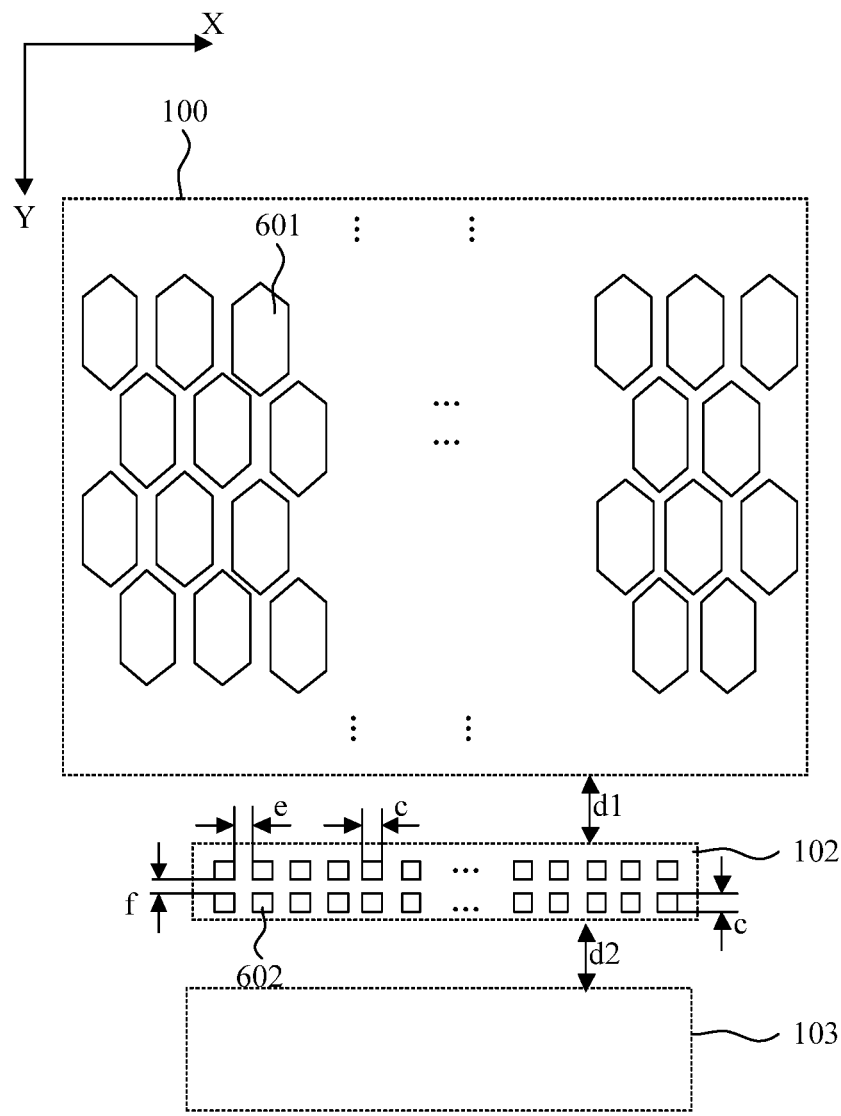
FIG. 24 is a schematic diagram of a display substrate after an eighth conductive layer is formed according to at least one embodiment of the present disclosure.

In some exemplary embodiments, the eighth insulating layer and the eighth conductive layer are sequentially formed on the base substrate on which the aforementioned structure is formed, as shown in FIGS. 23 and 24. Planar structures of the display region and the detection region are illustrated in FIGS. 23 and 24. As shown in FIG. 23, the eighth insulating layer of the display region 100 is provided with at least a plurality of twenty-first via holes V21, and the eighth insulating layer of the detection region 102 is provided with at least a plurality of twenty-second via holes V22. The eighth insulating layer in the plurality of twenty-first via holes V21 and twenty-second via holes V22 is removed. The twenty-first via holes V21 in the display region 100 correspond to the twenty-second via holes V22 in the detection region 102 one to one. The twenty-first via holes V21 expose a first end of the detection lead wire TL in the display region 100, and the twenty-second via holes V22 expose a second end of the detection lead wire TL in the detection region 102. In some examples, as shown in FIG. 23, projections of the twenty-first via holes V21 and the twenty-second via holes V22 on the base substrate may be rectangular. However, this is not limited in the present embodiment. For example, shapes of the projections of the twenty-first via holes and the twenty-second via holes on the base substrate may be the same or different, for example, they may all be circular, oval or square.

In some exemplary embodiments, in the detection region 102, a plurality of twenty-second via holes V22 may be arranged in an array, for example, in two rows. However, this is not limited in the present embodiment.

In some exemplary embodiments, in the display region 100, along the first direction X, a distance a between two adjacent twenty-first via holes V21 may range from 2330 microns to 3500 microns, for example, the distance a may be 2915 microns. Along the second direction Y, a distance b between two adjacent twenty-first via holes V21 may range from 1330 microns to 2000 microns, for example, the distance b may be 1656 microns. However, those are not limited in the present embodiment.

In some exemplary embodiments, as shown in FIG. 23, the detection lead wire TL may be formed by connecting a plurality of straight line segments, for example, the detection lead wire in the display region may extend to the detection region in an arrangement that avoids affecting the display effect of the display region. However, this is not limited in the present embodiment. For example, the detection lead wire may be formed by connecting a straight line segment and a curved line segment. In some exemplary embodiments, a wire width of the detection lead wire may range from 3.5 microns to 35 microns, for example, it may be 35 microns. However, this is not limited in the present embodiment.

In some exemplary embodiments, as shown in FIG. 24, the eighth conductive layer at least includes a first electrode 601 of the light-emitting element located in the display region 100, a detection electrode 602 located in the detection region 102, and a bonding electrode (not shown) located in the bonding region 103. The first electrode 601 of the light-emitting element may be an anode, and the first electrode 601 may be hexagonal and regularly arranged. The first electrode 601 in the display region 100 is connected with the first end of the detection lead wire TL through the twenty-first via hole V21, and the detection electrode 602 in the detection region 102 is connected with the second end of the detection lead wire TL through the twenty-second via hole V22, thereby realizing the electrical connection between the detection electrode 602 and the light-emitting element and the pixel circuit corresponding to the light-emitting element through the detection lead wire TL.

In some exemplary embodiments, as shown in FIG. 24, a plurality of detection electrodes 602 are regularly arranged in the detection region 102. At least one detection electrode 602 may be square, for example, a side length c of the detection electrode 602 may range from 55 microns to 85 microns, for example, the side length c is 70 microns. In the detection region 102, along the first direction X, a distance e between two adjacent detection electrodes 602 may range from 40 microns to 60 microns, for example, the distance e may be 50 microns. Along the second direction Y, a distance f between two adjacent detection electrodes 602 may range from 55 microns to 85 microns, for example, the distance f may be 70 microns. However, these are not limited in the present embodiment. For example, the detection electrode may be rectangular or circular.

In some exemplary embodiments, as shown in FIG. 24, along the second direction Y, a distance d1 between the display region 100 and the detection region 102 may range from 350 microns to 530 microns, for example, the distance d1 may be 440 microns. A distance d2 between the detection region 102 and the bonding region 103 may range from 350 microns to 530 microns, for example, the distance d2 may be 440 microns. For example, the distance d1 may be equal to the distance d2. However, these are not limited in the present embodiment.

(7) Sequentially forming a pixel define layer, a light-emitting functional layer, a cathode and an encapsulation layer on the base substrate.

In some exemplary embodiments, a pixel define film is coated on the base substrate on which the aforementioned structure is formed, and a pixel define layer (PDL) pattern is formed through masking, exposure and development processes. The pixel define layer is formed in the sub-pixel in the display region, and the pixel define layer in the sub-pixel is formed with a pixel opening exposing the anode. Then, a light-emitting functional layer is formed in the aforementioned formed pixel opening, and the light-emitting functional layer is connected with the anode of the light-emitting element. Then, a cathode film is deposited, and the cathode film is patterned by a patterning process to form a cathode pattern. The cathode is respectively connected with the light-emitting functional layer and the third power line Vcom. After that, an encapsulation layer is formed on the cathode. The encapsulation layer may include a stacked structure with inorganic material/organic material/inorganic material.

In some examples, the pixel define layer may be made of an inorganic material such as silicon oxide (SiOx), silicon nitride (SiNx), or silicon oxynitride (SiON). The anode may be made of a transparent conductive material such as indium tin oxide (ITO) or indium zinc oxide (IZO). The cathode may be made of any one or more of magnesium (Mg), silver (Ag), aluminum (Al), copper (Cu) and lithium (Li), or an alloy of any one or more of the above metals. However, this is not limited in the present embodiment. For example, the anode may be made of a reflective material such as metal, and the cathode may be made of a transparent conductive material.

The structure and its preparation process shown in the embodiments of the present disclosure are merely illustrative. In some exemplary embodiments, according to actual needs, corresponding structures may be changed and patterning processes may be added or reduced. For example, the pixel circuit may be 3T1C or 7T1C design. For another example, the first electrode of the first storage capacitor may be in the same layer and integrally formed with the control electrode of the drive transistor, and the second electrode of the first storage capacitor may be formed in the base substrate. For another example, the detection circuit may be provided in the detection region. However, the embodiments of the present disclosure do not make any limitation here.

The preparation process according to the embodiments of the present disclosure may be realized by using the existing mature preparation equipment, can be well compatible with the existing preparation process, and has advantages of simple process realization, easy implementation, high production efficiency, low production cost and high yield rate.

In the display substrate provided in this embodiment, the light-emitting element of the sub-pixel in the display region is connected with the detection electrode in the detection region through the detection lead wire, and connected with the detection circuit through the detection electrode, so that the electrical performance of the light-emitting elements is detected through the detection circuit, thus providing support for analysis of the defects of the display substrate.

At least one embodiment of the present disclosure further provides a preparation method of a display substrate, including: providing a base substrate including a display region and a peripheral region located at one side of the display region; and forming a plurality of sub-pixels, at least one detection electrode and a detection lead wire on the base substrate; wherein the plurality of sub-pixels are provided in the display region, and at least one of the plurality of sub-pixels includes a light-emitting element and a pixel circuit for driving the light-emitting element. The peripheral region includes a detection region, the at least one detection electrode is provided in the detection region, and the at least one detection electrode is electrically connected with a first electrode of the light-emitting element and a corresponding pixel circuit through the detection lead wire, so as to detect electrical performance of the light-emitting element through the detection electrode in the detection stage.

In some exemplary embodiments, forming the plurality of sub-pixels, the at least one detection electrode and the detection lead wire on the base substrate includes: sequentially forming an active layer, a first conductive layer, a second conductive layer, a third conductive layer, a fourth conductive layer, a fifth conductive layer, a sixth conductive layer, a seventh conductive layer and an eighth conductive layer on the base substrate. The active layer at least includes active regions of a plurality of transistors of the pixel circuit. The first conductive layer at least includes control electrodes of the plurality of transistors of the pixel circuit. The second conductive layer at least includes first and second electrodes of a plurality of transistors of the pixel circuit, the first power line, the second power line, the light-emitting control line and the data line. The third conductive layer at least includes a first adapter electrode for connecting the second electrode of the first transistor, the second electrode of the second transistor and the control electrode of the drive transistor, a second adapter electrode for connecting the control electrode of the first transistor and the first scanning signal line, and a third adapter electrode for connecting the control electrode of the second transistor and the second scanning signal line. The fourth conductive layer at least includes a first scanning signal line, a second scanning signal line, a first electrode and a second electrode of a first sub-capacitor. The fifth conductive layer at least includes a first electrode of a second sub-capacitor. The sixth conductive layer at least includes a second electrode of the second sub-capacitor. The first sub-capacitor and the second sub-capacitor are connected in parallel to form a first storage capacitor. The seventh conductive layer at least includes a fourth adapter electrode for connecting the first electrode of the first parallel sub-capacitor and the second electrode of the second parallel sub-capacitor of the first storage capacitor, and a detection lead wire extending from the display region to the detection region. A first end of the detection lead wire is connected with the second electrode of the drive transistor. The eighth conductive layer at least includes a first electrode of the light-emitting element located in the display region and a detection electrode located in the detection region. The first electrode of the light-emitting element is connected with the first end of the detection lead wire, and the detection electrode is connected with the second end of the detection lead wire.

Preparation method of this embodiment may refer to the descriptions of the aforementioned embodiments and will not be illustrated repeatedly here.

At least one embodiment of the present disclosure provides a detection method of a display substrate. The display substrate includes a base substrate including a display region and a peripheral region located at one side of the display region. The display region is provided with a plurality of sub-pixels, and at least one of the plurality of sub-pixels includes a light-emitting element and a pixel circuit for driving the light-emitting element. The peripheral region includes a detection region provided with at least one detection electrode which is electrically connected with a first electrode of the light-emitting element and the pixel circuit through a detection lead wire. The at least one detection electrode is electrically connected with a detection circuit, and the detection circuit includes a first control unit, a second control unit and a storage unit. The first control unit is respectively connected with the detection electrode, a first control terminal and a first node. The second control unit is respectively connected with a second control terminal, a first signal terminal and the first node. The storage unit is respectively connected with the first node and a first power terminal. The detection method includes: disconnecting the detection electrode from the first node under control of the first control terminal of the detection circuit and charging the first node through the first signal terminal under control of the second control terminal in a first sub-stage of detection stage; disconnecting the first signal terminal from the first node under control of the second control terminal of the detection circuit and supplying power to the detection electrode through the first node under control of the first control terminal in a second sub-stage of detection stage; disconnecting the detection electrode from the first node under control of the first control terminal of the detection circuit, collecting a voltage of the first node through the first signal terminal under control of the second control terminal, and determining electrical performance of the light-emitting element according to the voltage collected from the first signal terminal in a third sub-stage of detection stage.

In some exemplary embodiments, determining electrical performance of the light-emitting element according to the voltage collected from the first signal terminal includes at least one of the following:

when the light-emitting element is in a light-emitting state, calculating an average current of the light-emitting element according to the voltage collected from the first signal terminal in the third sub-stage; calculating an equivalent resistance of the light-emitting element according to the collected voltage and the calculated average current; and determining whether the light-emitting element is in a weak short state or a weak off state according to the equivalent resistance of the light-emitting element; and when the light-emitting element is in an extinguished state, determining a critical turn-on voltage of the light-emitting element according to the voltage collected from the first signal terminal in the third sub-stage.

Detection method of this embodiment may refer to the descriptions of the aforementioned embodiments and will not be illustrated repeatedly here.

Figure 25:
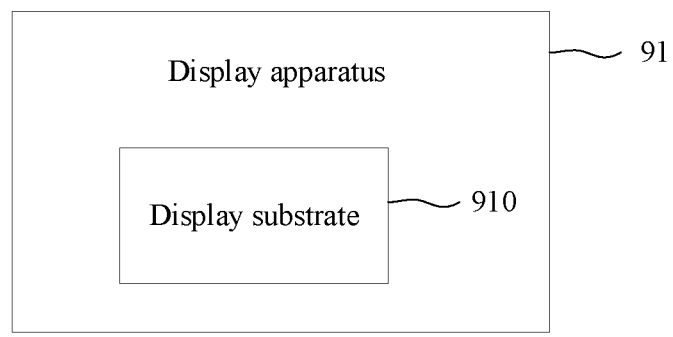
FIG. 25 is a schematic diagram of a display apparatus according to at least one embodiment of the present disclosure.

FIG. 25 is a schematic diagram of a display apparatus according to at least one embodiment of the present disclosure. As shown in FIG. 25, this embodiment provides a display apparatus 91, which includes a display substrate 910. The display substrate 910 is the display substrate provided in the previous embodiments. The display substrate 910 may be a micro OLED display substrate. The display apparatus 91 may be any product or component with a display function, such as an OLED panel, an OLED TV, a mobile phone, a tablet computer, a television, a display, a laptop computer, a digital photo frame, a navigator, etc. However, this is not limited in the present embodiment.

The drawings in the present disclosure only refer to the structures involved in the present disclosure, and common designs may be referred to for other structures. The embodiments of the present disclosure and the features in the embodiments may be combined with each other to obtain a new embodiment if there is no conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising:
a base substrate comprising a display region and a peripheral region located on at least one side of the display region;
wherein the display region is provided with a plurality of sub-pixels, and at least one of the plurality of sub-pixels comprises a light-emitting element and a pixel circuit for driving the light-emitting element;
the peripheral region comprises a detection region, and the detection region is provided with at least one detection electrode which is electrically connected with a first electrode of the light-emitting element and the pixel circuit through a detection lead wire, to detect electrical performance of the light-emitting element through the at least one detection electrode in a detection stage;
wherein the at least one detection electrode is electrically connected with a detection circuit provided in the peripheral region, or the at least one detection electrode is electrically connected with a detection circuit provided on an external circuit board;
wherein the detection circuit comprises a first control unit, a second control unit and a storage unit;
the first control unit is respectively connected with the detection electrode, a first control terminal and a first node, and is configured to supply power to the detection electrode through the first node under control of the first control terminal;
the second control unit is respectively connected with a second control terminal, a first signal terminal and the first node, and is configured to charge the first node through the first signal terminal or collect a voltage of the first node through the first signal terminal under control of the second control terminal; and
the storage unit is respectively connected with the first node and a first power terminal, and is configured to store a voltage of the first node.

2. The display substrate according to claim 1, wherein the first control unit comprises a fourth transistor, a control electrode of the fourth transistor is connected with the first control terminal, a first electrode of the fourth transistor is connected with the detection electrode, and a second electrode of the fourth transistor is connected with the first node;
the second control unit comprises a fifth transistor, a control electrode of the fifth transistor is connected with the second control terminal, a first electrode of the fifth transistor is connected with the first signal terminal, and a second electrode of the fifth transistor is connected with the first node; and
the storage unit comprises a second storage capacitor, a first electrode of the second storage capacitor is connected with the first node, and a second electrode of the second storage capacitor is connected with the first power terminal.

3. The display substrate of claim 1, a distance between adjacent detection electrodes in the detection region ranges from 40 microns to 85 microns.

4. The display substrate according to claim 1, wherein the peripheral region further comprises a bonding region located on a side of the display region, and the detection region is located between the display region and the bonding region.

5. The display substrate according to claim 4, wherein a distance between the detection region and the display region ranges from 350 microns to 530 microns, and a distance between the detection region and the bonding region ranges from 350 microns to 530 microns.

6. The display substrate according to claim 1, wherein a wire width of the detection lead wire ranges from 3.5 microns to 35 microns.

7. The display substrate according to claim 1, wherein the display region is rectangular, and is divided into nine rectangular sub-regions in a form of 3*3, the detection region comprises a plurality of detection electrodes, which are connected with first electrodes of light-emitting elements of sub-pixels at center positions and vertex positions of the nine rectangular sub-regions.

8. The display substrate according to claim 1, wherein in a direction perpendicular to the base substrate, the display substrate at least comprises an (N−1)th conductive layer and an Nth conductive layer which are sequentially provided away from the base substrate, wherein N is a positive integer;
the (N−1)th conductive layer at least comprises a detection lead wire extending from the display region to the detection region, and the detection lead wire is electrically connected with a pixel circuit corresponding to the light-emitting element; and
the Nth conductive layer at least comprises a first electrode of the light-emitting element located in the display region and a detection electrode located in the detection region, a first end of the detection lead wire is connected with the first electrode of the light-emitting element, and a second end of the detection lead wire is connected with the detection electrode.

9. The display substrate according to claim 1, wherein the pixel circuit comprises a drive sub-circuit, a voltage transmission sub-circuit and a data writing sub-circuit;
the drive sub-circuit comprises a control terminal, a first terminal and a second terminal;
the voltage transmission sub-circuit is configured to apply a first power voltage provided by a first power line to the first terminal of the drive sub-circuit in response to a light-emitting control signal;
the data writing sub-circuit is configured to write a data signal into the control terminal of the drive sub-circuit and store the data signal that has been written in response to a first scanning signal and a second scanning signal; and
the drive sub-circuit is configured to drive the light-emitting element to emit light under control of the control terminal and the first terminal of the drive sub-circuit.

10. The display substrate according to claim 9, wherein the drive sub-circuit comprises a drive transistor, the data writing sub-circuit comprises a first transistor, a second transistor and a first storage capacitor, and the voltage transmission sub-circuit comprises a third transistor;
a control electrode of the drive transistor is connected with the control terminal of the drive sub-circuit, a first electrode of the drive transistor is connected with the first terminal of the drive sub-circuit, and a second electrode of the drive transistor is connected with the second terminal of the drive sub-circuit;

a control electrode of the first transistor is connected with a first scanning signal line, a first electrode of the first transistor is connected with a data line, and a second electrode of the first transistor is connected with a control electrode of the drive transistor;

a control electrode of the second transistor is connected with a second scanning signal line, a first electrode of the second transistor is connected with the data line, and a second electrode of the second transistor is connected with the control electrode of the drive transistor;

a control electrode of the third transistor is connected with a light-emitting control line, a first electrode of the third transistor is connected with a first power line, and a second electrode of the third transistor is connected with the first electrode of the drive transistor;

a first electrode of the first storage capacitor is connected with the control electrode of the drive transistor, and a second electrode of the first storage capacitor is connected with a second power line;

a first electrode of the light-emitting element is connected with the second electrode of the drive transistor, and a second electrode of the light-emitting element is connected with a third power line.

11. The display substrate according to claim 10, wherein the first transistor is a first semiconductor type Metal Oxide Semiconductor (MOS) transistor, the second transistor, the third transistor and the drive transistor are all second semiconductor type MOS transistors, and a doping type of the first semiconductor type is opposite to that of the second semiconductor type.

12. The display substrate according to claim 10, wherein in a direction perpendicular to the base substrate, the display substrate comprises an active layer, a first conductive layer, a second conductive layer, a third conductive layer, a fourth conductive layer, a fifth conductive layer, a sixth conductive layer, a seventh conductive layer and an eighth conductive layer which are sequentially provided on the base substrate;

the active layer at least comprises active regions of a plurality of transistors of the pixel circuit;

the first conductive layer at least comprises control electrodes of the plurality of transistors of the pixel circuit;

the second conductive layer at least comprises first and second electrodes of the plurality of transistors of the pixel circuit, the first power line, the second power line, the light-emitting control line and the data line;

the third conductive layer at least comprises a first adapter electrode for connecting the second electrode of the first transistor, the second electrode of the second transistor and the control electrode of the drive transistor, a second adapter electrode for connecting the control electrode of the first transistor and the first scanning signal line, and a third adapter electrode for connecting the control electrode of the second transistor and the second scanning signal line;

the fourth conductive layer at least comprises the first scanning signal line, the second scanning signal line, and a first electrode and a second electrode of a first sub-capacitor;

the fifth conductive layer at least comprises a first electrode of a second sub-capacitor;

the sixth conductive layer at least comprises a second electrode of the second sub-capacitor;

the first sub-capacitor and the second sub-capacitor are connected in parallel to form the first storage capacitor;

the seventh conductive layer at least comprises a fourth adapter electrode for connecting the first electrode of the first sub-capacitor and the second electrode of the second sub-capacitor of the first storage capacitor, and a detection lead wire extending from the display region to the detection region, wherein a first end of the detection lead wire is connected with the second electrode of the drive transistor; and the eighth conductive layer at least comprises a first electrode of the light-emitting element located in the display region and a detection electrode located in the detection region; the first electrode of the light-emitting element is connected with a first end of the detection lead wire, and the detection electrode is connected with a second end of the detection lead wire.

13. The display substrate according to claim 1, wherein the pixel circuit comprises a drive sub-circuit, a voltage transmission sub-circuit and a data writing sub-circuit;

the drive sub-circuit comprises a control terminal, a first terminal and a second terminal;

the voltage transmission sub-circuit is configured to respectively apply a reset voltage and a first power voltage to the first terminal of the drive sub-circuit in response to a transmission control signal;

the data writing sub-circuit is configured to write a data signal into the control terminal of the drive sub-circuit and store the data signal that has been written in response to a first scanning signal and a second scanning signal;

the drive sub-circuit is configured to drive the light-emitting element to emit light under control of the control terminal and the first terminal of the drive sub-circuit; and the peripheral region is provided with a voltage control circuit, wherein the voltage control circuit is connected with the pixel circuit, and is configured to provide a reset voltage to the voltage transmission sub-circuit of the pixel circuit in response to a reset control signal and to provide a first power voltage to the voltage transmission sub-circuit of the pixel circuit in response to a light-emitting control signal.

14. The display substrate according to claim 13, wherein the drive sub-circuit comprises a drive transistor, the data writing sub-circuit comprises a first transistor, a second transistor and a first storage capacitor, and the voltage transmission sub-circuit comprises a third transistor; the voltage control circuit comprises a sixth transistor and a seventh transistor;

a control electrode of the drive transistor is connected with the control terminal of the drive sub-circuit, a first electrode of the drive transistor is connected with the first terminal of the drive sub-circuit, and a second electrode of the drive transistor is connected with the second terminal of the drive sub-circuit;

a control electrode of the first transistor is connected with a first scanning signal line, a first electrode of the first transistor is connected with a data line, and a second electrode of the first transistor is connected with a control electrode of the drive transistor;

a control electrode of the second transistor is connected with a second scanning signal line, a first electrode of the second transistor is connected with the data line, and a second electrode of the second transistor is connected with the control electrode of the drive transistor;

a control electrode of the third transistor is connected with a transmission control line, a first electrode of the third transistor is connected with a second electrode of the sixth transistor and a first electrode of the seventh transistor, and a second electrode of the third transistor is connected with a first electrode of the drive transistor;

a first electrode of the first storage capacitor is connected with the control electrode of the drive transistor, and a second electrode of the first storage capacitor is connected with a second power line;

a control electrode of the sixth transistor is connected with a reset control line, a first electrode of the sixth transistor is connected with a reset voltage line, a control electrode of the seventh transistor is connected with a light-emitting control line, and a second electrode of the seventh transistor is connected with a first power line; and a first electrode of the light-emitting element is connected with the second electrode of the drive transistor, and a second electrode of the light-emitting element is connected with a third power line.

15. A display apparatus, comprising the display substrate according to claim 1.

16. A preparation method of a display substrate, comprising:

providing a base substrate comprising a display region and a peripheral region located on at least one side of the display region; and forming a plurality of sub-pixels, at least one detection electrode and a detection lead wire on the base substrate; wherein the plurality of sub-pixels are provided in the display region, at least one of the plurality of sub-pixels comprises a light-emitting element and a pixel circuit for driving the light-emitting element; the peripheral region comprises a detection region, the at least one detection electrode is provided in the detection region and is electrically connected with a first electrode of the light-emitting element and the pixel circuit through a detection lead wire, to detect electrical performance of the light-emitting element through the detection electrode in a detection stage;

forming a detection circuit in the peripheral region or on an external circuit board; wherein the at least one detection electrode is electrically connected with the detection circuit provided in the peripheral region, or the at least one detection electrode is electrically connected with the detection circuit provided on the external circuit board; wherein the detection circuit comprises a first control unit, a second control unit and a storage unit the first control unit is respectively connected with the detection electrode, a first control terminal and a first node, to supply power to the detection electrode through the first node under control of the first control terminal; the second control unit is respectively connected with a second control terminal, a first signal terminal and the first node, to charge the first node through the first signal terminal or collect a voltage of the first node through the first signal terminal under control of the second control terminal; and the storage unit is respectively connected with the first node and a first power terminal, to store a voltage of the first node.

17. A detection method of a display substrate, the display substrate comprising: a base substrate comprising a display region and a peripheral region located on at least one side of the display region, wherein the display region is provided with a plurality of sub-pixels, and at least one of the plurality of sub-pixels comprises a light-emitting element and a pixel circuit for driving the light-emitting element; the peripheral region comprises a detection region, and the detection region is provided with at least one detection electrode which is electrically connected with a first electrode of the light-emitting element and the pixel circuit through a detection lead wire; the at least one detection electrode is electrically connected with a detection circuit, and the detection circuit comprises a first control unit, a second control unit and a storage unit; the first control unit is respectively connected with the detection electrode, a first control terminal and a first node, the second control unit is respectively connected with a second control terminal, a first signal terminal and the first node, and the storage unit is respectively connected with the first node and a first power terminal;

wherein the detection method comprises:

in a first sub-stage of a detection stage, disconnecting the detection electrode from the first node under control of the first control terminal of the detection circuit, and charging the first node through the first signal terminal under control of the second control terminal;

in a second sub-stage of the detection stage, disconnecting the detection electrode from the first node under control of the second control terminal of the detection circuit, and supplying power to the detection electrode through the first node under control of the first control terminal; and in a third sub-stage of the detection stage, disconnecting the detection electrode from the first node under control of the first control terminal of the detection circuit, collecting a voltage of the first node through the first signal terminal under control of the second control terminal, and determining electrical performance of the light-emitting element according to the voltage collected from the first signal terminal.

18. The detection method according to claim 17, wherein determining electrical performance of the light-emitting element according to the voltage collected from the first signal terminal comprises at least one of the following:

when the light-emitting element is in a light-emitting state, calculating an average current of the light-emitting element according to the voltage collected from the first signal terminal in the third sub-stage; calculating an equivalent resistance of the light-emitting element according to the collected voltage and the calculated average current; and determining whether the light-emitting element is in a weak short state or a weak off state according to the equivalent resistance of the light-emitting element; and when the light-emitting element is in an extinguished state, determining a critical turn-on voltage of the light-emitting element according to the voltage collected from the first signal terminal in the third sub-stage.

* * * * *